United States Patent [19]
Uchikawa et al.

[11] Patent Number: 6,021,833
[45] Date of Patent: Feb. 8, 2000

[54] MANUFACTURING LINE FOR MULTI-LAYERED PRINTED CIRCUIT BOARDS

[75] Inventors: Katsumi Uchikawa; Keiji Arai; Kouji Takamachi; Tohru Matsui; Ryo Fujita; Tohru Goto; Shigemitsu Matsumoto; Shuntaro Takizawa; Shuji Higuchi; Takanori Kobayashi; Koichi Takemata, all of Kawasaki, Japan

[73] Assignee: Fujitsu Limited, Kawasaki, Japan

[21] Appl. No.: 08/713,253

[22] Filed: Sep. 12, 1996

[30] Foreign Application Priority Data

Apr. 22, 1996 [JP] Japan ................................. 8-100559

[51] Int. Cl.[7] .................................................. H05K 3/46
[52] U.S. Cl. ........................... 156/521; 29/825; 29/829; 29/846; 156/150; 205/666; 221/1; 427/96
[58] Field of Search ..................... 156/150, 521; 29/829, 846, 825; 221/1; 205/666; 427/96

[56] References Cited

U.S. PATENT DOCUMENTS 5,628,112   5/1997   Maslar et al. ............................. 29/846

FOREIGN PATENT DOCUMENTS 4-3119   1/1992   Japan .

Primary Examiner—Deborah Jones
Assistant Examiner—Robert R. Koehler
Attorney, Agent, or Firm—Armstrong, Westerman, Hattori, McLeland & Naughton

[57] ABSTRACT

A manufacturing line including a plurality of processing sections disposed in a series for manufacturing multi-layered printed circuit boards by continuously conveying and processing boards through the plurality of processing sections, in which the plurality of processing sections have at least two specific processing sections for conducting a common type of processes, and the specific processing sections are disposed in a common area.

21 Claims, 21 Drawing Sheets

MANUFACTURING LINE FOR MULTI-LAYERED PRINTED CIRCUIT BOARDS

BACKGROUND OF THE INVENTION

1. Field of the Invention

The present invention relates to a manufacturing line for mainly manufacturing multi-layered printed circuit boards and, more particularly, to a manufacturing line for laminating an insulating layer and a conductor layer on a copper-clad laminate to complete the multi-layered printed circuit board.

2. Description of the Related Arts

Conventionally, the method of manufacturing multi-layered printed circuit boards has been generally employed in which an insulating layer and a conductor layer are alternately laminated on a copper-clad board repeatedly depending on the design of the printed circuit board.

The manufacturing method involves repeating steps of polishing a copper foil on the copper-clad board, forming a resist layer, exposing the resist layer to light, and patterning the copper foil by etching treatment. Accordingly, a trial has been made in which some of these steps are continuously carried out (as disclosed, for example, in Japanese Examined (Kokoku) Patent Publication No. Hei 4(1992)-3119).

In recent years, there has been an increasing need for various kinds of multi-layered printed circuit boards. In order to cope with this, it seems preferable, in view of the manufacturing efficiency, to construct a single manufacturing line in which the processing sections performing each of the steps are arranged continuously.

However, when all the processing sections are arranged in the form of a single manufacturing line, a problem occurs such that, since the same kind of processing sections (for example, exposure processing sections or etching processing sections) dot in the line, equipments incidental to the processing sections (for example, a clean room, a darkroom, a drainage equipment, and the like) must be individually prepared, rendering the incidental equipments complicated.

SUMMARY OF THE INVENTION

The present invention has been made in view of the above circumstances and the purpose thereof is to provide a manufacturing line capable of efficiently manufacturing multi-layered printed circuit boards with a minimum number of incidental equipments.

The present invention provides a manufacturing line comprising a plurality of processing sections disposed in a series for manufacturing printed circuit boards by continuously conveying and processing boards through the plurality of processing sections, in which the plurality of processing sections include at least two specific processing sections for conducting a common type of processes, and the specific processing sections are disposed in a common area.

DETAILED DESCRIPTION OF THE PREFERRED EMBODIMENTS

Figure 1:
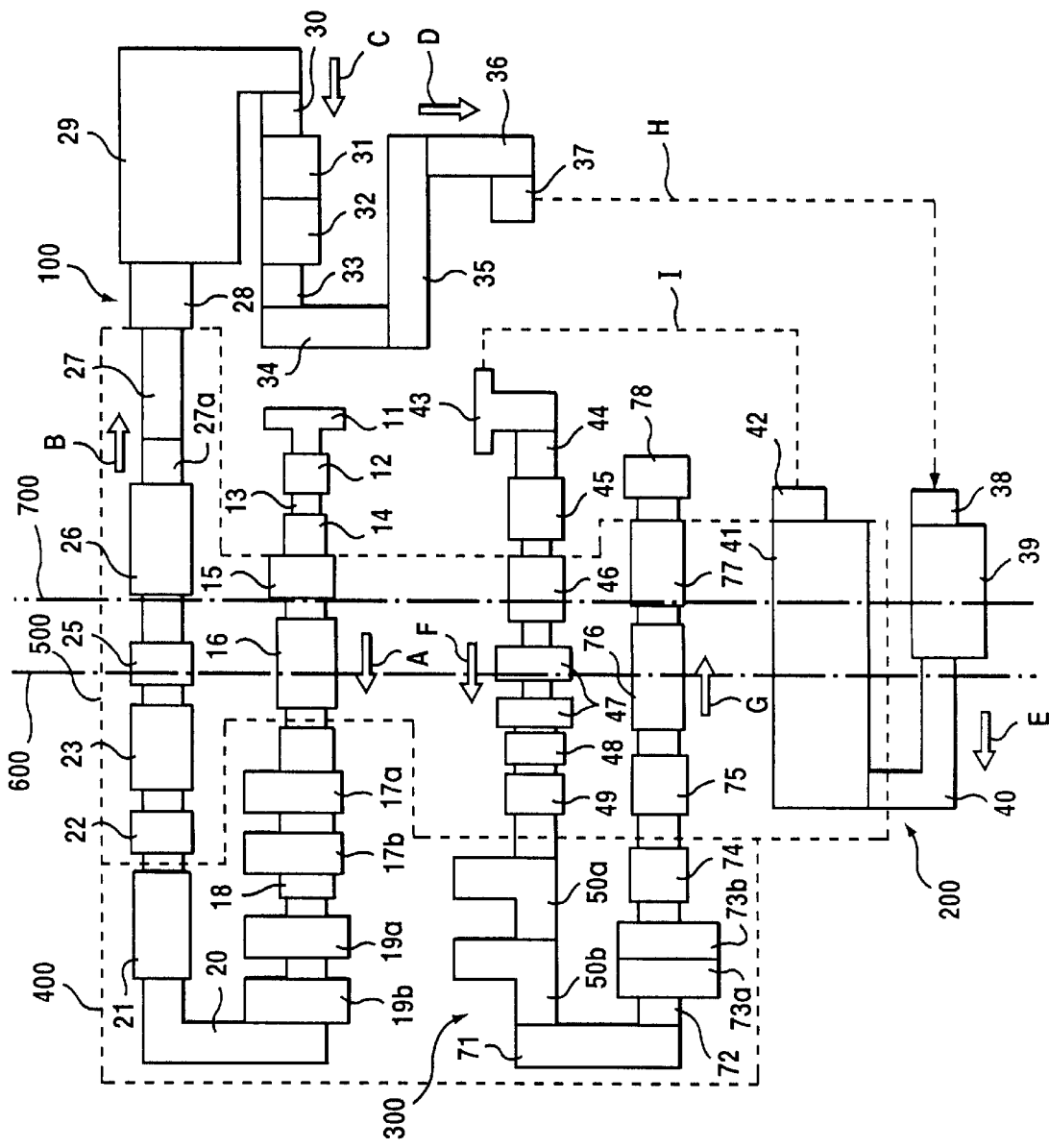
FIG. 1 is a plan view for showing an arrangement of a manufacturing line in accordance with an embodiment of the present invention.

1. A feature in layout of the manufacturing line

In the manufacturing line provided by the present invention, the plurality of processing sections disposed in a series is a plurality of processing sections disposed so that necessary processing steps may be successively carried out onto a conveyed board. An example thereof is a plurality of processing sections disposed so as to manufacture multi-layered printed circuit boards by repeating a series of processing steps comprising patterning a copper foil on a copper-clad board, laminating an insulating layer and a copper foil thereon, and further patterning the laminated copper foil.

In the manufacturing line according to the present invention, the specific processing sections are preferably light exposure processing sections, and the common area is preferably a clean area.

Alternatively, the specific processing sections are preferably wet processing sections that require feeding and draining of water, and in which the common area comprises a water feed and drainage system capable of commonly processing the feeding and draining of each of the wet processing sections.

Further, the manufacturing line is preferably partitioned into a plurality of sublines disposed in a field, wherein inlet and outlet sections of the sublines are disposed in a local area of the field.

The plurality of sublines are, for example, a plurality of sublines divided so that each of the sublines include a processing section such as a light exposure processing section or an etching processing section. This increases the flexibility in providing a concentrated or close arrangement of the same kind of processing sections.

To dispose inlet sections and outlet sections in a local area of the field means to dispose as closely as possible the inlet sections and the outlet sections which the plurality of sublines comprises. This facilitates connection between the sublines, i.e. an operation to supply boards that are discharged from a subline to another subline.

In order to dispose the inlet sections and the outlet sections in a local area of the field, it is preferable that each of the sublines is laid out in an approximately U-like shape between the supplying section and the discharging section.

Also, it is preferable that, when each of the sublines includes a light exposure processing section conformably, the light exposure processing sections of the sublines are disposed in a common clean area. By such an arrangement, only one area such as a clean room can accommodate all the light exposure processing sections.

Here, the light exposure processing section is, for example, a processing section for forming a resist film on a board, a processing section for exposing the resist film to form a circuit pattern, or the like.

Further, it is preferable that, when each of the sublines includes a wet processing section as a conformable processing section, the wet processing sections of the sublines are disposed in an area where water feeding and drainage systems, for example, equipments having water feeding and drainage pipes are utilized in common. This simplifies the construction and arrangement of the water feeding and drainage systems.

Here, the wet processing section is a processing section for carrying out a process using a solution or water such as an etching, plating, or oxidizing process.

Preferably, the manufacturing line or the subline according to the present invention comprises a plurality of processing sections for processing a plurality of boards that are serially conveyed and includes a stock section for storing a plurality of boards during the manufacturing steps, the stock section supplying the boards directly downstream when the manufacturing line is operating and provisionally storing the boards when the manufacturing line stops operating.

When the manufacturing line stops, the boards processed in the upstream of the stock section are all stored in the stock section if the supply of the boards to the inlet of the line is stopped earlier by a determined period than the stoppage time of the manufacturing line, the determined period being a period of time for the board to reach the stock section. Accordingly, no unfinished board will be left on the line.

Assuming the period of time for one board to go through all the processing steps in the manufacturing line or the subline to be T hours, the stock section is disposed preferably at a position where the board arrives after approximately T/2 hours from the beginning of the series of processing steps. In this case, if the line is stopped after T/2 hours from the stoppage time of the supply of the boards, there will be no unfinished boards left on the line in the upstream or downstream of the stock section, so that it will be easy to resume operation of the line.

Also, even if the boards are supplied immediately when the line starts to operate next time, the line in the upstream of the stock section can begin to process the supplied boards, whereas the line in the downstream of the stock section can begin to process the boards discharged from the stock section, thereby maintaining high utilization efficiency of the line. Here, the board is, for example, a copper-clad laminate.

2. A feature of a structure of a multi-layered printed circuit board

The multi-layered printed circuit board according to the present invention preferably comprises a copper-clad laminate and a surface conductor layer stuck to the surface thereof via a thermoset insulating resin layer, the copper-clad laminate including a glass cloth, an unwoven glass cloth, an epoxy resin, and a copper foil.

Here, it is preferable to use a board formed by employing the following method as the copper-clad laminate. First, an unwoven glass cloth sandwiched between two glass cloths is prepared as a base material. Then, the base material is formed into a board-like shape by use of an epoxy resin, and a copper foil is attached to the surface thereof. It is preferable to use the copper-clad laminate made by the above method because the unwoven cloth used as a base material provides good hole-processing property and makes it easy to form a through-hole.

An example of the copper-clad laminate is a commercially available unwoven glass cloth copper-clad board CEM-3 (manufactured by Matsushita Electric Works, Ltd. in Japan).

An example of the thermoset insulating resin is a bisphenol-type epoxy resin. The surface conductor layer is, for example, a copper foil.

3. A feature of the manufacturing line for various designs

In order to cope with the various designs in the present invention, the manufacturing line preferably comprises a first subline and a second subline, the first subline including a plurality of processing sections for forming a circuit pattern on a conductor layer on one surface or both surfaces of a board and for laminating a conductor layer thereon via an insulating layer, and the second line including a plurality of processing sections for forming a through hole in a board having conductor layers on both surfaces thereof and for forming a circuit pattern on each of the conductor layers.

When each of the sublines is constructed as above, it is possible to obtain a multi-layered printed board having a desired number of layers by subjecting a one-sided or double-sided copper-clad laminate board to the first subline at least one time and then subjecting the board to the second subline. This makes it easy to cope with the change of design in the number of layers of the board.

Here, the first line or the second line may be further divided in accordance with the arrangement of the processing sections.

4. A feature of main processing sections in the manufacturing line

The manufacturing line according to the present invention is preferably one in which the board has a metal foil disposed on a surface thereof and in which the plurality of processing sections disposed in a series include a polish processing section for subjecting the metal foil on the surface of the board to surface roughening, the polish processing section comprising a conveyor roller for conveying the board, a sensor for detecting the position of the board, a first polishing roller and a second polishing roller for rotating respectively in a forward direction and in a backward direction with respect to the conveying direction of the board while being in contact with the surface of the conveyed board, and a controller for temporarily stopping the first polishing roller before the rear end of the board is released from the first polishing roller, and for driving the first polishing roller after the rear end of the board is released, for temporarily stopping the second polishing roller before the front end of the board is brought into contact with the second polishing roller, and for driving the second polishing roller after the front end of the board is brought into contact.

This ensures that the second polishing roller to temporarily stop before the front end of the board is brought into contact with the second polishing roller which is rotating backward, so that the front end of the board is not damaged by being kicked by the second polishing roller at the time of contact. Also, the first polishing roller temporarily stops before the rear end of the board is released from the first polishing roller which is rotating forward, so that the rear end of the board is not damaged by being kicked by the first polishing roller at the time of release.

Further, in the present invention, it is preferable that the plurality of processing sections disposed in a series include a dip coating section for forming a photoresist film on a surface of the board, the dip coating section comprising a resist tank for storing a resist solution and an elevator for dipping the board into the resist solution with the surface thereof being vertical and lifting it up, in which the elevator halfway pulls up the board dipped in the resist solution, lifts down the board again, and pulls the board out of the resist solution.

The elevating apparatus halfway pulls up the board dipped in the resist solution with the surface of the board being vertical and, after the resist surface coated onto an upper portion of the board is somewhat dried, dips the board again into the resist solution, and pulls it up. This makes it possible to coat the upper portion of the board with a resist for two times, thereby making the thickness of the resist film uniform.

Also, in the present invention, it is preferable that the board has a copper foil disposed on a surface thereof and that the plurality of processing sections disposed in a series include an oxidation processing section for subjecting to a black oxidation process the surface of the copper foil which has been processed in the wet processing section, and that the oxidation processing section comprises a liquid tank through which the board is continuously conveyed horizontally while being dipped in the oxidation processing solution. This enables performing a black oxidation process of the boards in a continuous manner.

Preferably, the oxidation processing section further comprises a pre-processing section for supplying the board to the liquid tank after the surfaces of the board are wetted by water. This is for preventing generation of processing irregularities due to partial black oxidation of the surface of the board by coming into contact with the vapor of the oxidation processing solution just before the board is supplied into the liquid tank.

Also, in the present invention, it is preferable that the plurality of processing sections disposed in a series include, as a subsequent step to the oxidation processing section, an insulating layer forming section for forming an insulating layer by coating a liquid-like resin on a surface of the board processed in the oxidation processing section, the insulating layer forming section comprising a table on which the board is mounted to be conveyed and an ejection head for ejecting a band-shaped liquid-like resin onto a surface of the board to a length corresponding to the size of the board in the conveying direction, the resin having a width corresponding to the size of the board in the direction perpendicular to the conveying direction. This makes it possible to accurately form a thin and uniform insulating layer having a thickness of, for example, about 100 $\mu$m on a surface of the board.

In the present invention, it is preferable that the plurality of processing sections disposed in a series include a spray coating section for forming a photoresist film on a surface of the board, the spray coating section comprising a receiving and delivering section for the boards, a suspension conveyor section for repeating an operation of conveying to the delivering section the board received through the receiving section while suspending the board with a suspender having a conductor and returning back to the receiving section, an electrostatic coating section for applying a voltage via the suspender to the board conveyed from the receiving section to the delivering section and electrostatically coating the liquid-like resist by spraying, and a washing section for washing the suspenders returning to the receiving section from the delivering section.

Since the resist attached to the suspender at the time of spraying the resist is washed away in the washing section and the board is always suspended by the washed suspender, the electric conduction between the board and the suspender is secured, so that a voltage is always normally applied to the board via the suspender.

Here, the washing of suspenders is efficiently carried out by a washing apparatus that performs ultrasonic cleaning of the suspenders in an alkaline solution followed by washing the suspenders with water and drying.

In the present invention, it is preferable that the plurality of processing sections disposed in a series include a processing section for forming through-holes on the board and a filling section for filling the through-holes of the board with a filling material, the filling section comprising a conveyor section for conveying the board while holding the board horizontally, a coating roller for applying the filling material onto the lower surface of the conveyed board to fill the through-hole with the filling material, an upper squeegee and a lower squeegee for removing respectively the unnecessary filling material ejecting on the upper surface of the board through the through-hole and the unnecessary filling material applied onto the lower surface, in which the lower squeegee is disposed downstream of the upper squeegee in the conveying direction of the boards.

If the lower squeegee is disposed downstream of the upper squeegee, there will be a good effect such that, even if the filling material having filled the through-hole by use of the coating roller subsides in the through-hole by the operation of the upper squeegee, the filling material is pushed up from the bottom surface by the lower squeegee, so that the through-hole is sufficiently filled with the filling material.

In the present invention, it is preferable that the plurality of processing sections disposed in a series include an identifier affixing section for affixing onto the board an identifier representing the kind of board, and have an identifying section for reading the identifier as a previous step to the light exposure processing section.

This makes it possible for the light exposure processing section to identify the kind of board on the basis of the identifier which has been read by the identifying section and to carry out a light exposure processing in accordance with the corresponding pattern.

Here, it is preferable that the identifier consists of apertures formed by punching the board, whereby the identifier allows the kind of board to be identified by eye inspection and that the identifier is also identifiable by an optical reading means. An example of the optical reading means to be used is a photointerrupter.

EXAMPLES

FIG. 1 is a plan view for showing a manufacturing line in accordance with an embodiment of the present invention.

Figure 2:
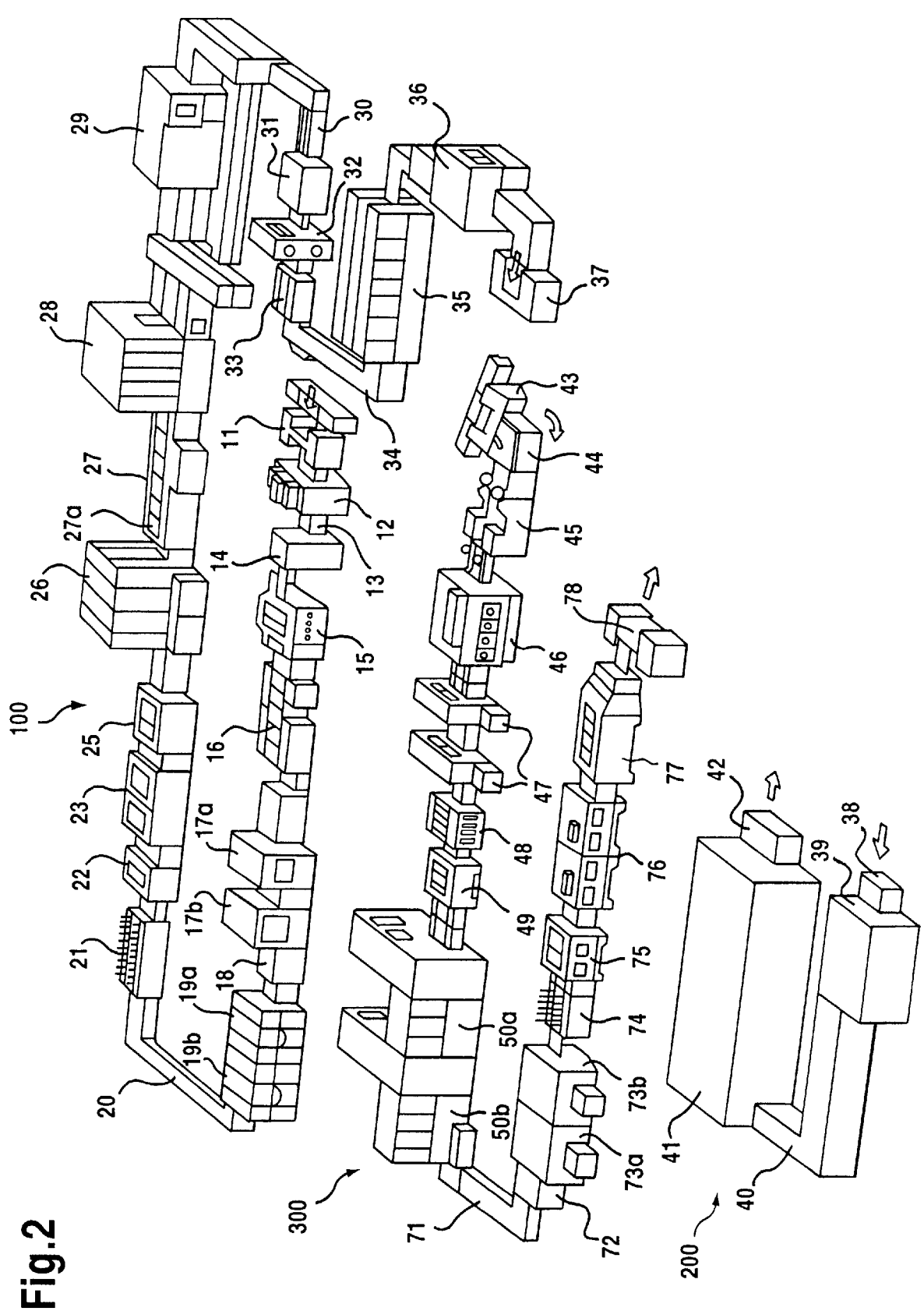
FIG. 2 is a perspective view for showing the arrangement of the manufacturing line in accordance with the embodiment of the present invention.

FIG. 2 is a perspective view for showing an essential part of FIG. 1, and FIGS. 3(a) to 3(j) are cross sectional views for showing, step by step, the printed circuit board manufactured in the manufacturing line of the embodiment.

The manufacturing line consists of three sublines 100, 200, and 300. The subline 100 is a line for forming a circuit pattern on a board having conductor layers on both sides thereof and for further forming a conductor layer on each side of the board via an insulating film. The subline 200 is a line for forming through-holes in a board and for conducting through-hole plating. The subline 300 is a line for forming a circuit pattern on a board having conductor layers on both sides thereof.

In other words, the manufacturing line is constructed so that various kinds of multi-layered printed circuit boards having, for example, 4 layers, 6 layers, 8 layers, and 10 layers by repeatedly performing the process of subline 100 at least one time and subsequently performing the processes of subline 200 and subline 300. In this example, it is assumed that the processing steps proceed from subline 100 through subline 200 to subline 300 in order to manufacture a four-layer printed circuit board.

Also, sublines 100, 200, and 300 each include a light exposure processing section (a laser drafting apparatus) and a wet processing section (such as an etching processing apparatus, a developing processing apparatus, an exfoliation processing apparatus, and a plating processing apparatus), as mentioned later. As shown in FIG. 1, the light exposure processing sections are disposed in a common clean room 400, and the wet processing sections are disposed in a common area 500 having a water feeding passageway 600 and a drainage passageway 700 in common.

Also, as shown in FIG. 1, a stock apparatus 26 is provided on the subline 100. Since the period of time from the supply to the discharge of the board on the subline 100 is about six hours, the stock apparatus 26 is disposed at a position which the board material reaches three hours after being supplied into the subline 100.

In this embodiment, a copper-clad board is supplied as a material to be processed from a supplier 11 of the subline 100. The structure of the board is such that copper foils 52 and 53 are pasted on both sides of an insulating board 51, as shown in FIG. 3(a). A copper-clad laminate CEM-3 (manufactured by Matsushita Electric Works, Ltd. in Japan) having a thickness of 1.2 mm (which may be 0.9 mm or 1.6 mm) is used as the board.

Figure 4:
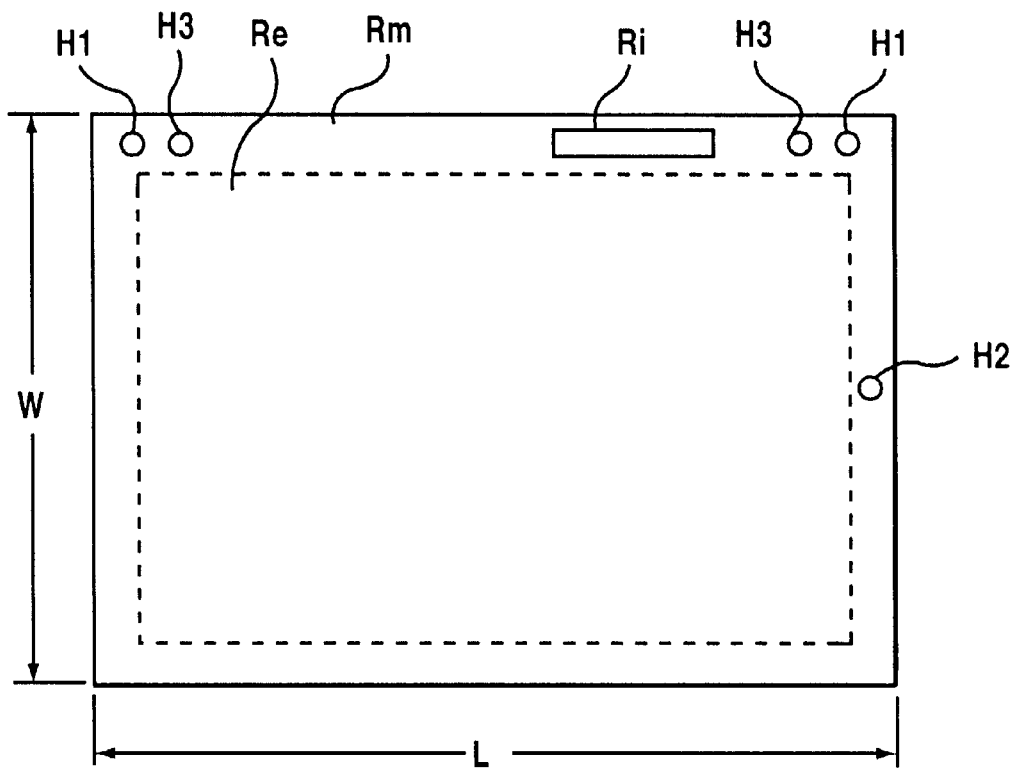
FIG. 4 is a plan view for showing a copper-clad laminate board in accordance with the embodiment of the present invention.

The board dimension is such that the length L of the board along the conveying direction on the manufacturing line is 340 mm (which may be, at the maximum, 550 mm depending on the design), and the width W of the board is a constant value of 340 mm. As shown in FIG. 4, on the board are disposed an effective area Re for forming a circuit pattern and a margin area Rm disposed along the margin of the effective area for providing various kinds of processing information such as an identifier representing the kind (design) of the board, a positioning mark (an alignment mark), and a base hole.

Figure 5:
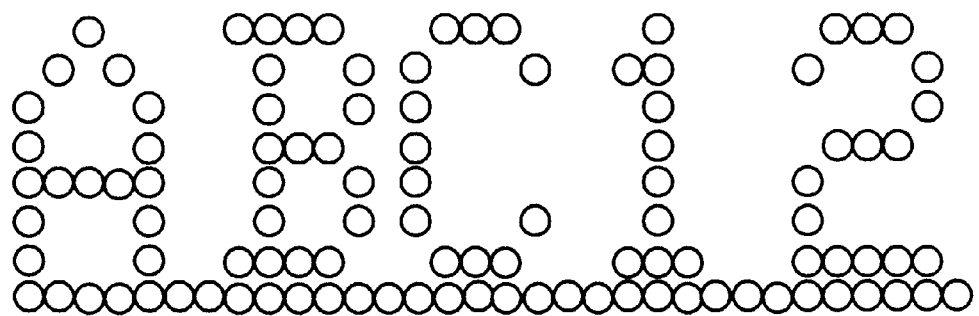
FIG. 5 is a view for explaining an identifier in accordance with the embodiment of the present invention.

The supplied board is conveyed to an identifier affixing apparatus 12, in which a series of letters comprising alphabets and numbers are punched through the board as an identifier in an area Ri (FIG. 4) for affixing the identifier of the board, as shown in FIG. 5.

The board is then conveyed to an identifier reading apparatus 13, in which the affixed identifier is optically read and confirmed by a photointerrupter. The board is further conveyed to a base hole creating apparatus 14, in which the board is drilled to create a base hole H1 which will be used for aligning the board in the subline 100, as shown in FIG. 4.

The board is then polished in a polishing apparatus 15, and is further subjected to surface-roughening treatment with an etchant solution in a shower line apparatus 16. Subsequently, resist films 54, 55 and cover coating films 56, 57 are respectively formed on the board by dipping method in dip coating apparatus 17a, 17b, as shown in FIG. 3(b).

Next, the identifier of the board is optically read in an identifier reading apparatus 18, and laser drafting apparatus 19a, 19b apply a laser beam in accordance with a circuit pattern corresponding to the identifier and a base mark H2 (FIG. 4) for positioning, thereby exposing the resist films 54, 55 on the board.

Then, the board is sent to an ordinary temperature retaining apparatus 21 via a transit conveyor 20, held at an ordinary temperature for a predetermined period of time, and passed through a developing processing apparatus 22, an etching processing apparatus 23, and an exfoliation processing apparatus 25 for developing, etching, and exfoliation. A circuit pattern is then formed on copper foils 52, 53, as shown in FIG. 3(c) and, at the same time, a portion of the copper foil at the base mark H2 is exfoliated.

Next, the board is sent through a stock apparatus 26 and a pre-processing apparatus 27a to an oxidation processing apparatus 27 for black oxidation processing of the copper foils 52, 53.

Figure 3F:
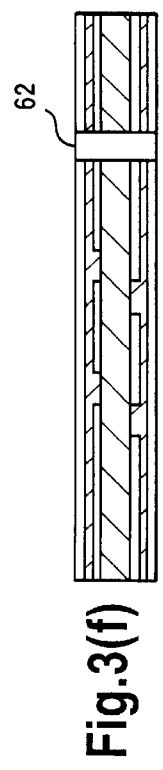
FIGS. 3(a) to 3(j) are cross sectional views for showing steps of manufacturing a printed circuit board in accordance with the embodiment of the present invention.
Figure 3G:
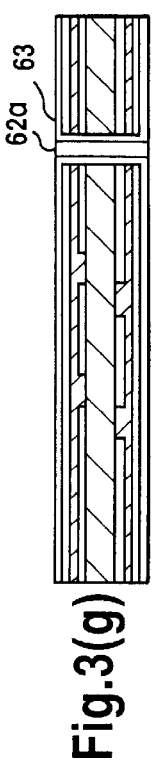
Figure 3H:
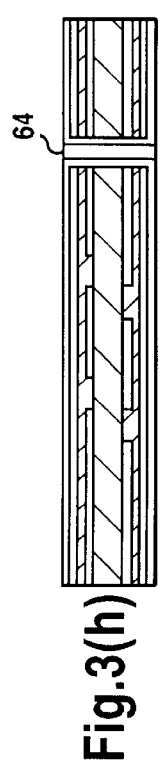
Figure 3I:
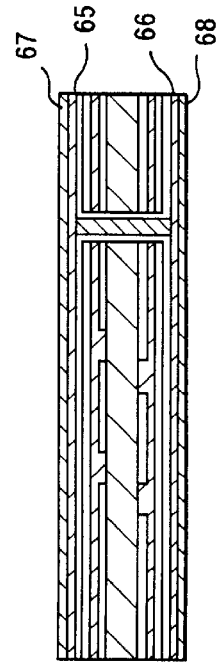
Figure 3J:
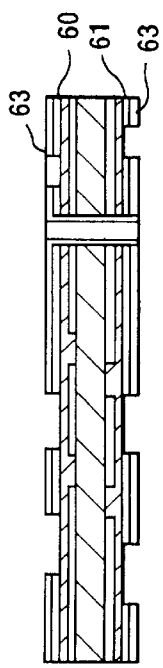
Figure 3A:
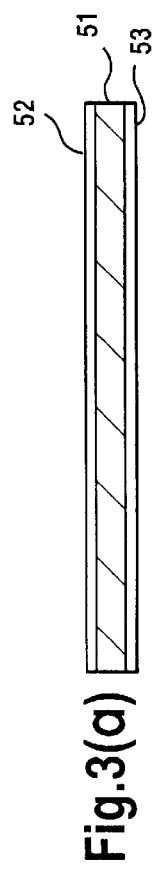
Figure 3B:
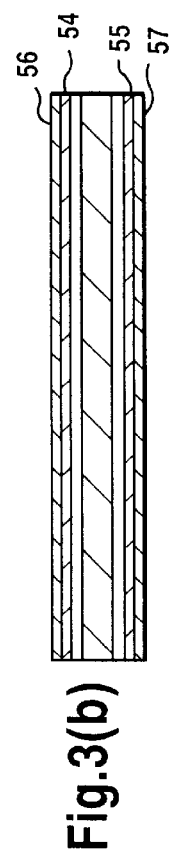
Figure 3C:
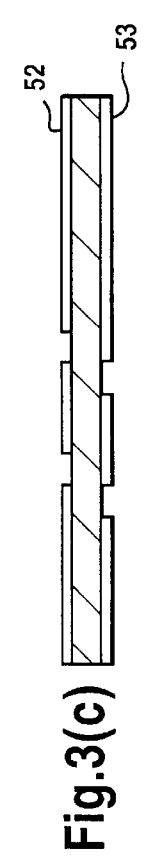
Figure 3D:
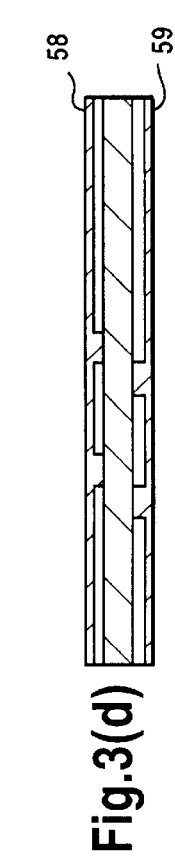

The board is then dried in a drying apparatus 28, and insulating layers 58, 59 are formed in an insulating layer forming apparatus 29, as shown in FIG. 3(d).

Figure 3E:
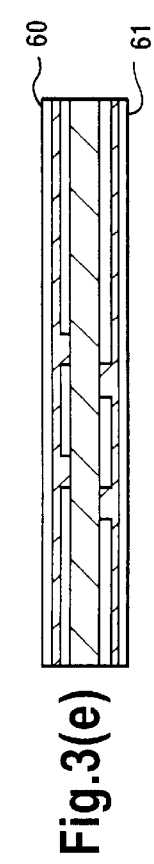

Next, the board is left to stand for a while in an accumulation apparatus 30, and then heated and dried in an conveyor furnace 31. A copper foil lamination apparatus 32 laminates copper foils 60, 61 on the dried board by using an adhesive agent, as shown in FIG. 3(e).

Further, the board is left to stand for a while in an accumulation apparatus 33, and then conveyed to a hardening apparatus 35 via a transit conveyor 34. The hardening apparatus 35 heats the board to sufficiently stick the copper foils 60, 61 onto the insulating layers 58, 59.

Then an X-ray hole processing apparatus 36 detects with an X-ray the base mark H2 (FIG. 4) covered by the copper foil laminated in the copper foil lamination apparatus 32, conducts a hole processing at the detected position, and conveys the board to a discharger 37. The board discharged from the discharger 37 is transported via a passageway H by an operator, as shown in a broken line H (FIG. 1), and then is supplied to a supplier 38 of the subline 200.

On the supplied board, a hole processing apparatus 39 forms a hole 62 for a through-hole using, as a base, the hole made at the base mark H2, as shown in FIG. 3(f). The board is then conveyed to a plating processing apparatus 41 via a conveyer apparatus 40 (FIG. 1). A copper plating layer 63 is formed in the plating processing apparatus 41, as shown in FIG. 3(g), thereby completing the through-hole 62a. The board is then discharged from the discharger 42.

The board discharged from the discharger 42 is transported by an operator via a passageway I (FIG. 1) to be supplied into a supplier 43 of the subline 300. The identifier of the supplied board is optically read in the identifier reading apparatus 44.

Then, a hole filling apparatus 45 fills the through-hole 62a of the board with a filling ink 64, as shown in FIG. 3(h). An ultraviolet exposing apparatus 46 hardens the ink. Next, the surface of the board is polished by a beltsander 47 and a buff polishing apparatus 48, and then is subjected to surface roughening treatment in a soft etching apparatus 49.

Next, spray coating apparatus 50a, 50b form resist films 65, 66 and cover coating films 67, 68, respectively, on the surfaces of the board by an electrostatic coating method, as shown in FIG. 3(i). The board is then conveyed via a transit conveyor 71 to an identifier reading apparatus 72 to read the identifier optically.

Further, laser drafting apparatus 73a, 73b apply a laser beam corresponding to the circuit pattern based on the identifier to expose the resist films 65, 66, respectively. After the board is held at an ordinary temperature for a predetermined period of time in an ordinary temperature retaining apparatus 74, the board is passed through a developing processing apparatus 76, an etching processing apparatus 76, and an exfoliation processing apparatus 77 for developing, etching, and exfoliation processes, thereby patterning the copper foils 60, 61 as well as the plating layer 63, as shown in FIG. 3(j).

The four-layer printed circuit board thus completed is discharged from the discharger 78.

Hereinafter, embodiments of the main processing apparatus will be explained.

1. A Polishing Apparatus

Figure 6:
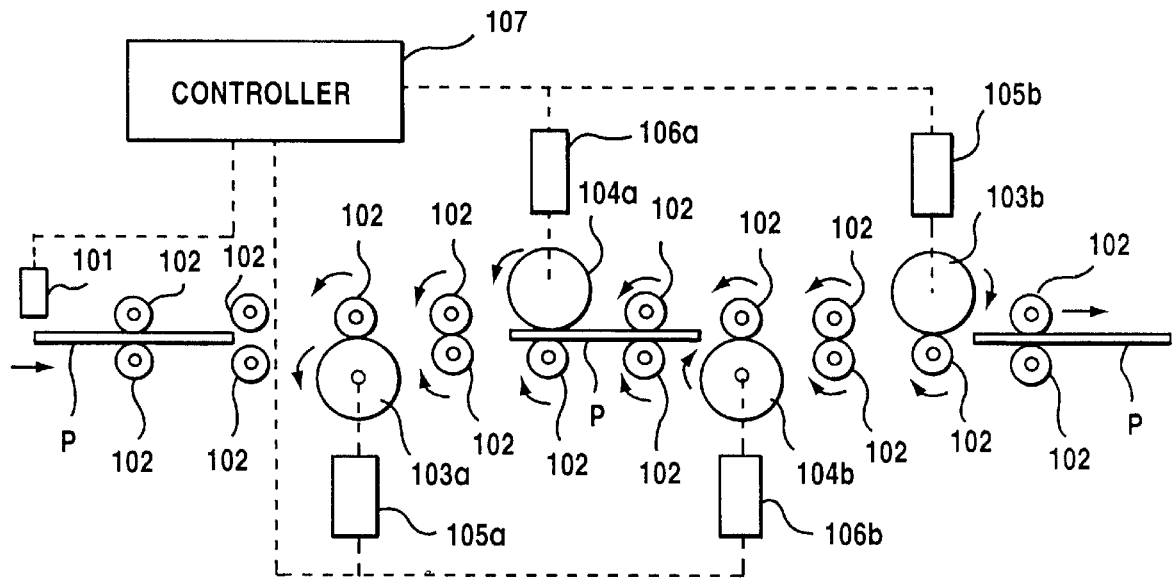
FIG. 6 is a view for explaining a construction of a polishing apparatus in accordance with the embodiment of the present invention.

The polishing apparatus 15 provided on the subline 100 is for brush-polishing the surface of the copper foil to obtain satin-like finish as a pretreatment step for forming a resist film on the board. The polishing apparatus 15 is constructed as shown in FIG. 6. Namely, the polishing apparatus 15 comprises a sensor 101 for detecting the front end, the rear end, and the length of the board P, a conveyor roller 102 for conveying the board P, backward polishing rollers 103a, 103b for brush-polishing the board P in a backward direction with respect to the conveying direction, forward polishing rollers 104a, 104b for brush-polishing the board P in a forward direction with respect to the conveying direction, motors 105a, 105b for driving the backward polishing rollers 103a, 103b respectively, motors 106a, 106b for driving the forward polishing rollers 104a, 104b respectively, and a controller 107 for controlling the motors 105a, 105b, 106a, 106b by receiving an output of the sensor 101. The conveyor roller 102 is kept being driven all the time at a fixed speed by a motor (not shown).

If the board P is transported from the left side to the right side in FIG. 6 and the front end of the board P reaches a position 10 mm away from the point of contact with the forward polishing roller 103a while all the conveyor rollers and the forward and backward polishing rollers are rotating, the backward polishing roller 103a stops rotating. When the board P is further conveyed by a conveyor roller 102 and the front end of the board P proceeds 15 mm forward to be sufficiently in contact with the backward polishing roller 103a, the backward polishing roller 103a is driven to polish the board P.

When the board P further advances to be polished by the forward polishing roller 104a and the rear end of the board P reaches a position 10 mm away from the point of release from the forward polishing roller 104a, the forward polishing roller 104a stops rotating. When the board P is conveyed by a conveyor roller 102 and the rear end of the board P proceeds 15 mm further to be sufficiently released from the forward polishing roller 104a, the forward polishing roller 104a is driven again. The forward polishing roller 104b and the backward polishing roller 103b are driven and controlled in the same manner.

Controlling the forward and backward polishing rollers in this way ensures that, even if the board has a low rigidity, the board can be safely polished without being entangled into or kicked by the forward and backward rollers.

2. A Dip Coating Apparatus

Figure 7:
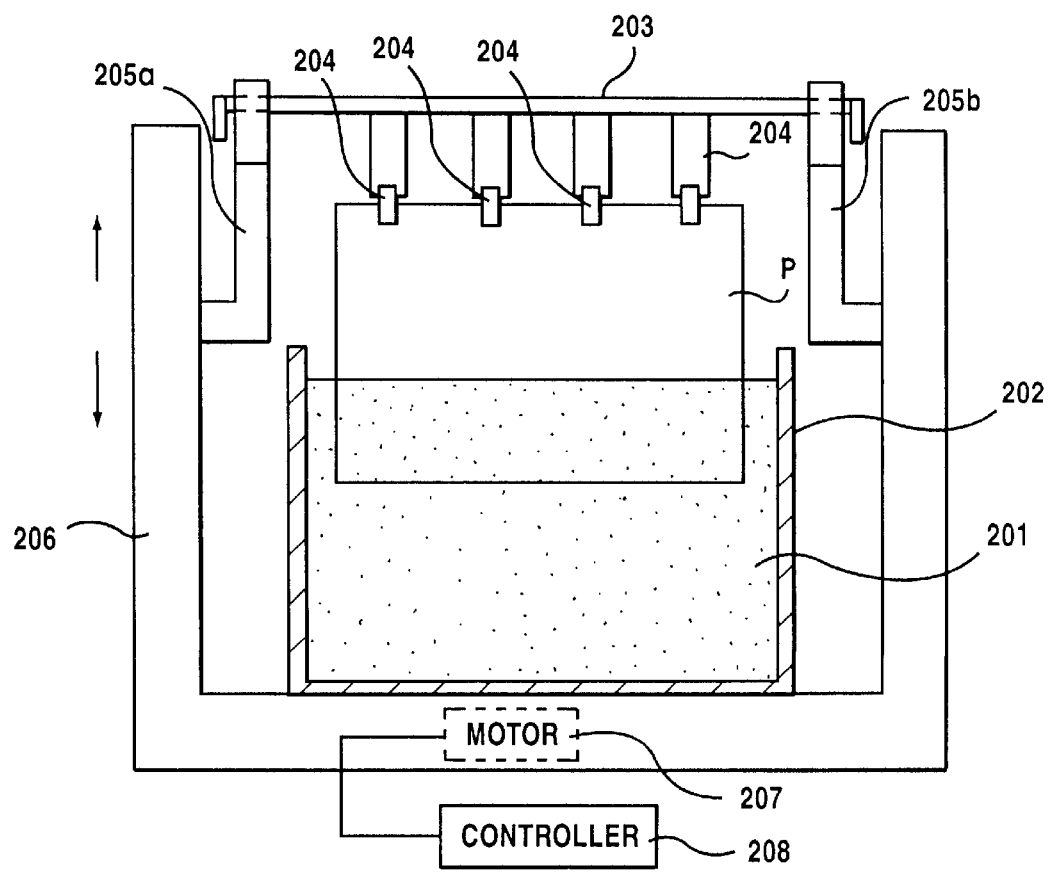
FIG. 7 is a view for explaining a construction of a dip coating apparatus in accordance with the embodiment of the present invention.

The essential part of a dip coating apparatus 17a for forming a resist film on the boards by dip coating is constructed as shown in FIG. 7.

Namely, the dip coating apparatus 17a comprises a resist tank 202 for storing a resist solution 201, a hanger 203 having a clamp claw 204 for gripping the board P, two arms 205a, 205b for detachably holding the ends of the hanger 203, an elevator 206 for simultaneously lifting the arms 205a, 205b up and down, a motor 207 with a rotary encoder for driving the elevator 206, and a controller 208 for controlling the motor 207.

A supplying apparatus (not shown) loads the board P to the hanger 203. The hanger 203 is then mounted onto the arms 205a, 205b.

Next, the arms 205a, 205b descend to dip the board P into the resist solution 201 up to immediately below the clamp claw 204, lift the board P up for about ⅓ of the dipping depth, stop the arms 205a, 205b at this position for 30 minutes, descend again to dip the board P up to immediately below the clamp claw 204, and then gradually ascend to take the board P up from the resist solution 201.

By controlling the dip speed in this way, it is possible to dip the upper portion (the clamp claw side) of the board P to make the thickness of the applied resist film (3 to 6 $\mu$m) uniform. Since the elevation position of the board P is detected by a rotary encoder provided in the motor 207, the controller 208 controls the speed of the motor 207 based on the detected position.

As the resist solution 201, an LDI resist (manufactured by Kansai Paint Co., Ltd. in Japan) which is a liquid-like photosensitive material may be used.

The board P lifted up from the resist tank 201 is then dried in a drying furnace (not shown) and is transported to an adjacent dip coating apparatus 17b. The dip coating apparatus 17b has a structure similar to the dip coating apparatus 17a. However, instead of the resist solution, a cover coating solution is applied onto the resist layer of the board P and is dried to form a uniform cover coating film having a thickness of 2 to 3 μm.

Here, a cover coating solution containing vinyl acetate and PVA as major components may be used. Forming a cover coating layer on a resist layer prevents hardening inhibition of the resist layer by oxygen, thereby preventing decrease in the photosensitivity.

3. A laser Drafting Apparatus

Laser drafting apparatus 19a and 19b have similar structures, and one of the apparatus exposes the resist layer on the front surface of the board, while the other apparatus exposes the resist layer on the rear surface of the board.

Figure 8:
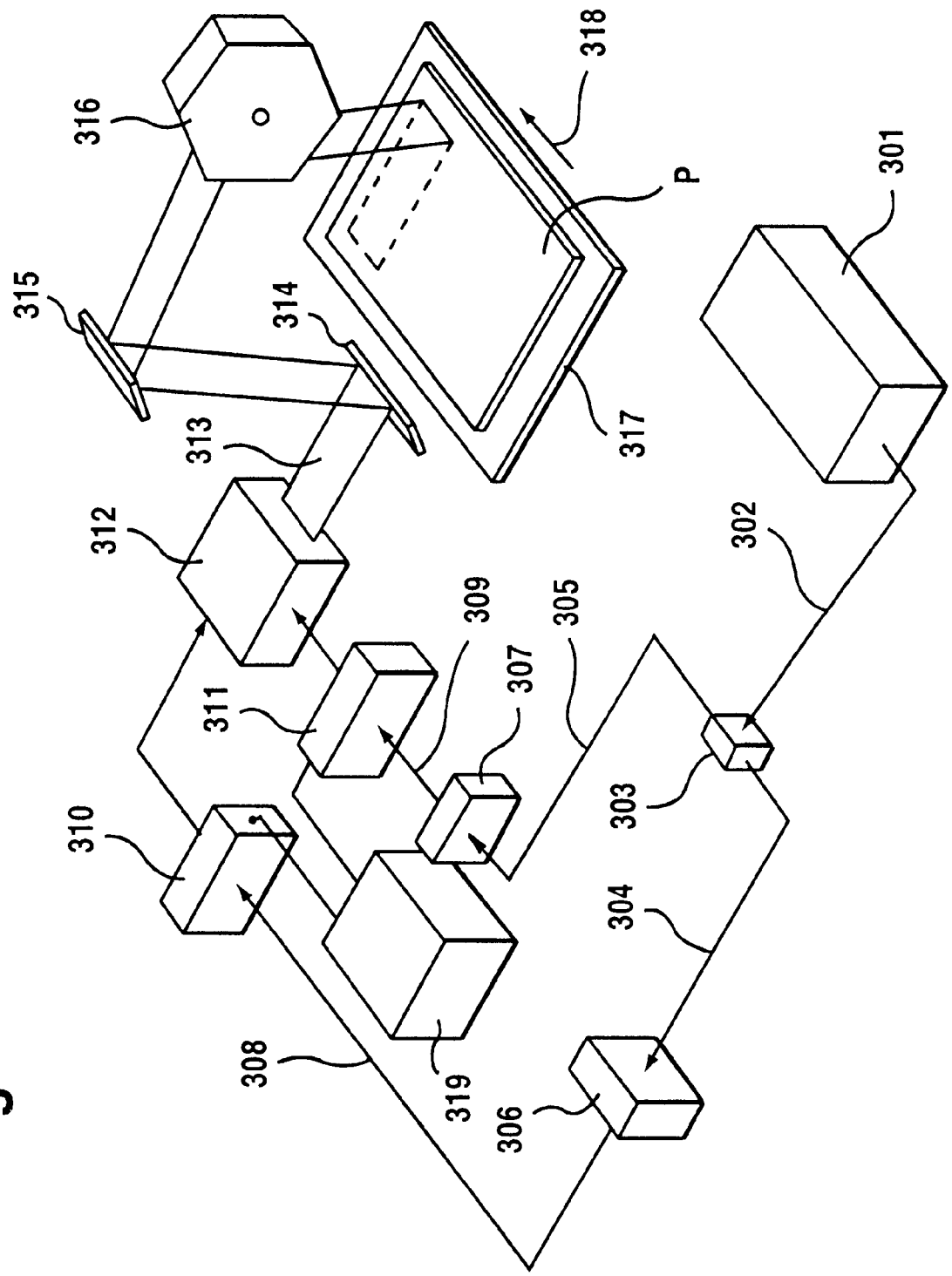
FIG. 8 is a view for explaining a construction of a laser drafting apparatus in accordance with the embodiment of the present invention.

FIG. 8 is a view for explaining a drafting method of the laser drafting apparatus 19a, in which a laser beam 302 having a wavelength of 488 nm emitted by a laser source 301 is divided into beam 304 and beam 305 by a half mirror 303. Further, the beams 304, 305 are each divided into eight beams by beam separators 306, 307 to form eight-channel beams 308, 309, respectively.

After the beams 308, 309 are each modulated into on-off light signals by acousto-optical elements 310, 311, the sixteen beams are synthesized by a beam splitter 312 into a drafting beam 313 arranged in a line with a pitch of 10 μm. The drafting beam 313 is reflected by mirrors 314, 315 and a rotating polygon mirror 316 to scan the board P.

Since the board P is mounted on a table 317 moving in a direction shown by an arrow 318, the board P is successively scanned by the drafting beam 313 to expose the resist film on the board P.

Here, the controller 319 controls the acousto-optical elements 310, 311 so that the acousto-optical elements 310, 311 may modulate the laser beams in accordance with the circuit pattern based on the identifier of the board P.

4. A Stock Apparatus

Figure 10:
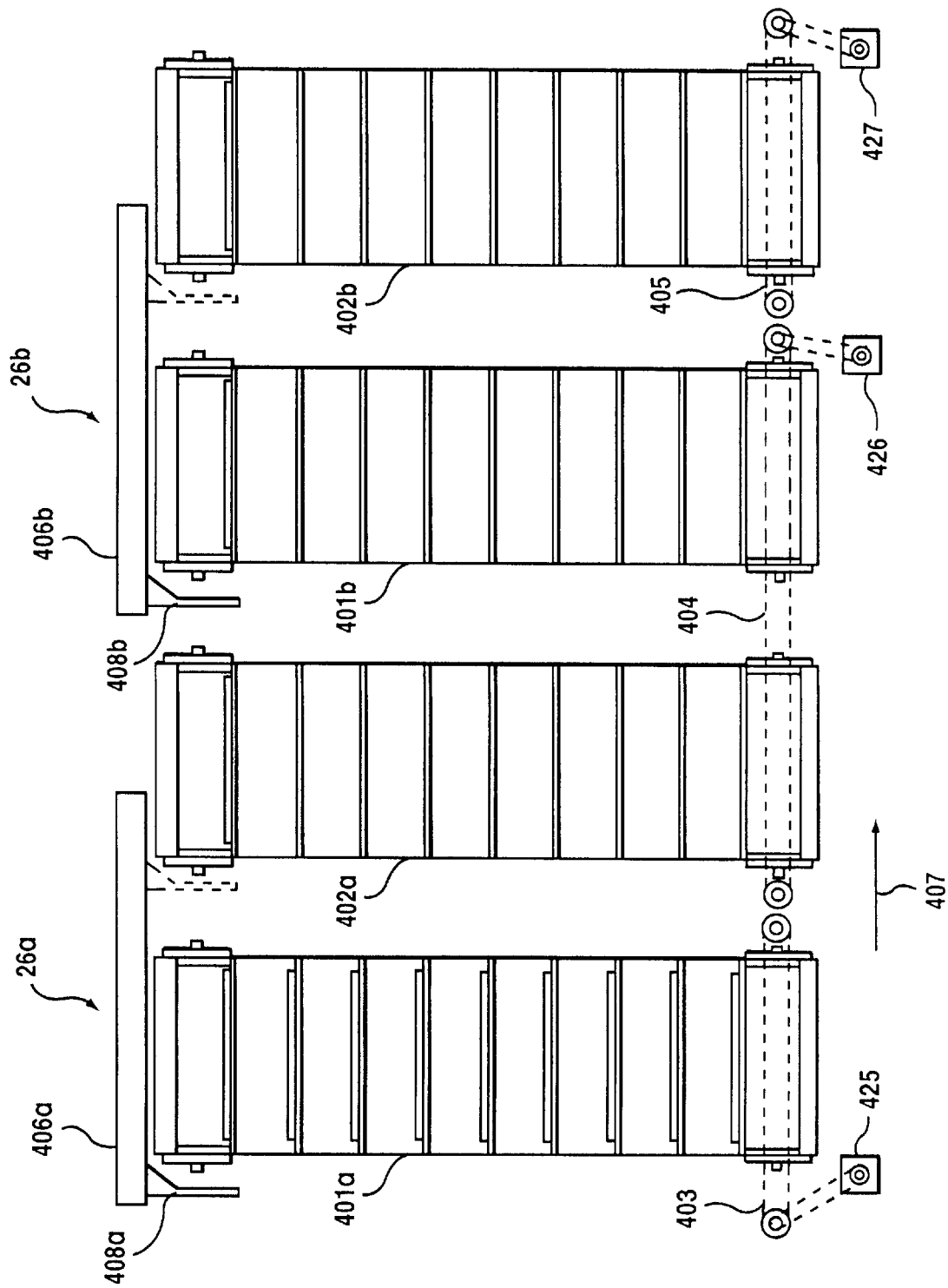
FIG. 10 is a side view for showing the stock apparatus in accordance with the embodiment of the present invention.

Referring to FIG. 10, the stock apparatus 26 comprises two stockers 26a, 26b having the same structure. The stockers 26a, 26b each include ascending stockers 401a, 401b, and descending stockers 402a, 402b. At the bottom of the stockers 26a, 26b are disposed three belt conveyors 403, 404, 405. At the top thereof are provided air cylinders 406a, 406b comprising board thrusting bars 408a, 408b each movable in a direction shown by an arrow 407.

Figure 9:
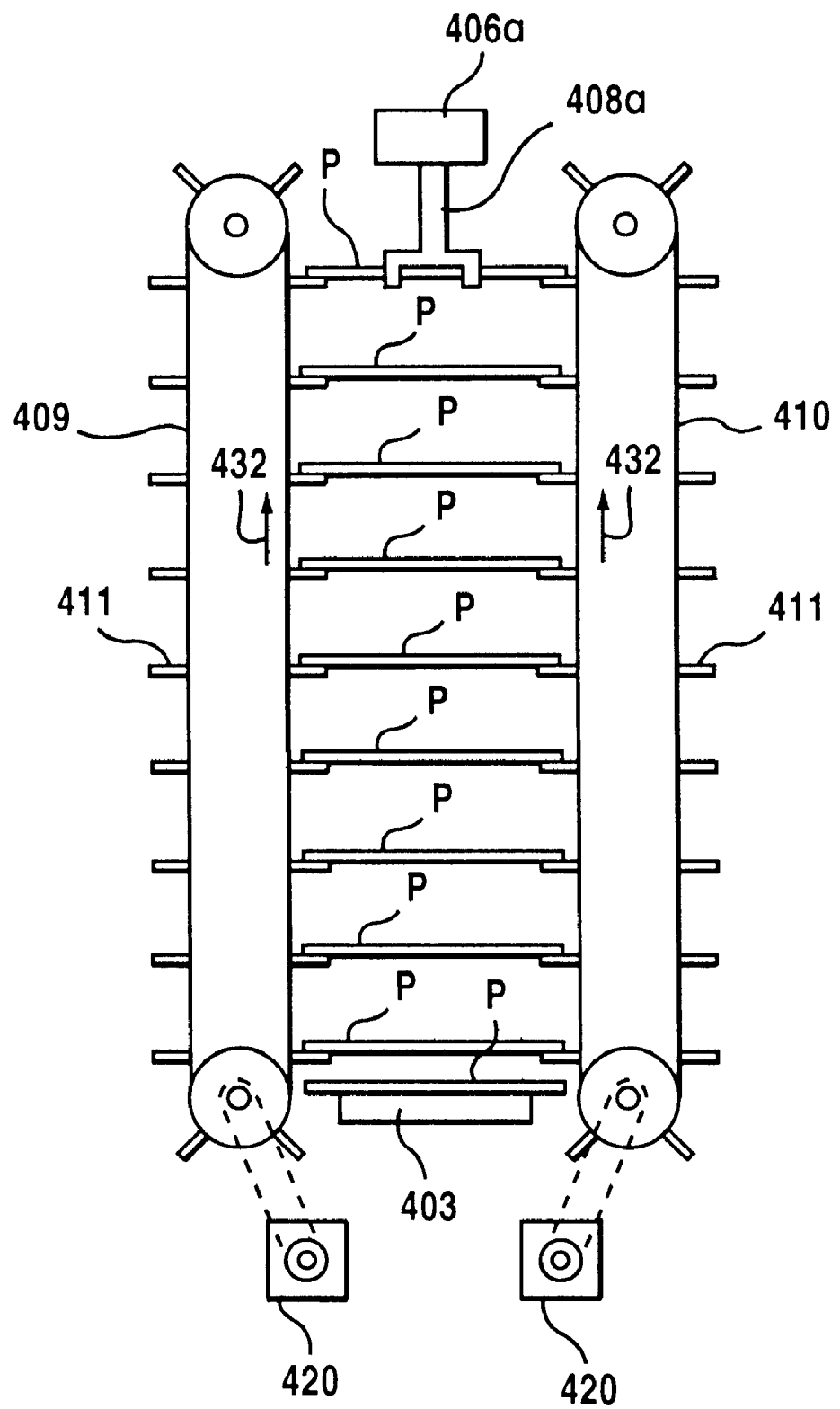
FIG. 9 is a front view for showing a stock apparatus in accordance with the embodiment of the present invention.

In the ascending stocker 401a, there are provided a pair of endless chains 409, 410 disposed to stand in parallel, as shown in FIG. 9. Each of the endless chains 409, 410 is equipped with a plurality of band-like engagement pieces 411 for supporting and lifting up both ends of the board P when the endless chains 409, 410 move in a direction shown by an arrow 432.

The ascending stocker 401b and the descending stockers 402a, 402b are also constructed as shown in FIG. 9. However, the endless chains in the ascending stockers move in a direction opposite to the direction in which the endless chains in the descending stockers move. When the ascending stocker 401a stores a board P, the engagement pieces 411 receive the board P on the belt conveyor 403, ascend to a height of a predetermined pitch, and stop there to store the board P.

When boards P have been stored up to the top of the ascending stocker 401a, the air cylinder 406a is driven to operate the board thrusting bar 408a to transport the board P to the top of the descending stocker 402a to secure a storing space in the ascending stocker 401a for storing the next board P. The operation of the ascending stocker 401b and the air cylinder 406b are almost the same.

The descending stockers 402a, 402b lift down the boards P that have been transported from the ascending stockers 401a, 401b, respectively, onto the belt conveyors 404, 405 to discharge the boards P.

Figure 11:
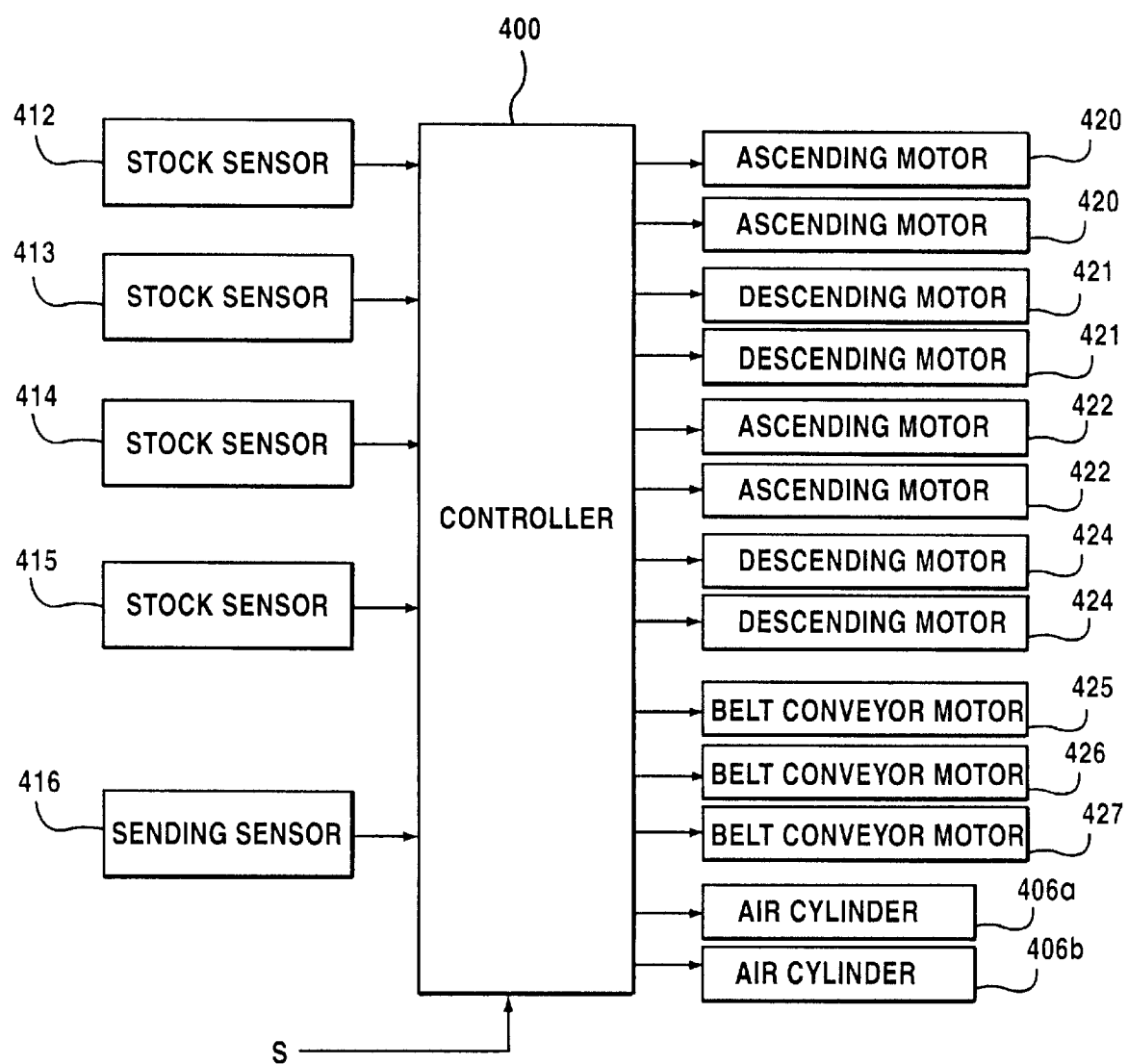
FIG. 11 is a block diagram for showing a controlling circuit of the stock apparatus in accordance with the embodiment of the present invention.

FIG. 11 is a block diagram for showing a control circuit for controlling the stockers 26a, 26b. The control section 400 receives an instruction signal S from outside, receives outputs from the stock sensors 412, 413, 414, 415 for detecting and outputting the positions where the boards P are stored in the ascending stockers 401a, 401b and the descending stockers 402a, 402b, and receives outputs from the sending sensor 416 for detecting and outputting the position of the board P when the board P is located on the belt conveyors 403, 404, 405.

Based on these, the control section 400 controls to drive the ascending motors 420, 422 for driving the ascending stockers 401a, 401b, the descending motors 421, 424 for driving the descending stockers 402a, 402b, the belt conveyor motors 425, 426, 427 for respectively driving the belt conveyors 403, 404, 405, and the air cylinders 406a, 406b.

The control section 400 executes three modes, namely, a "pass mode", a "receiving mode", and a "discharging mode" in accordance with the instruction signal S. When no instruction signals are received, the control section 400 executes a "pass mode" and passes the conveyed boards P right through the belt conveyors 403, 404, 405 to discharge the boards P. When a "receiving mode" is designated by the instruction signal S, the control section 400 judges whether there is room for stock in the ascending stockers 401a, 401b and transports the boards P to under an ascending stocker having room to store the boards P therein.

When a "discharging mode" is designated by the instruction signal S, the control section 400 judges whether any boards P are stocked in the descending stockers 402a, 402b and lifts down the stocked boards P onto the corresponding belt conveyor to discharge the boards P.

If no boards P are stocked in the descending stockers 402a, 402b, the control section 400 searches for boards P in the ascending stockers 401a, 401b and, if any boards are found stocked, lifts down the stocked boards P onto the corresponding belt conveyor via the descending stockers 402a, 402b to discharge the boards P.

5. Oxidation Processing Apparatus

Figure 12:
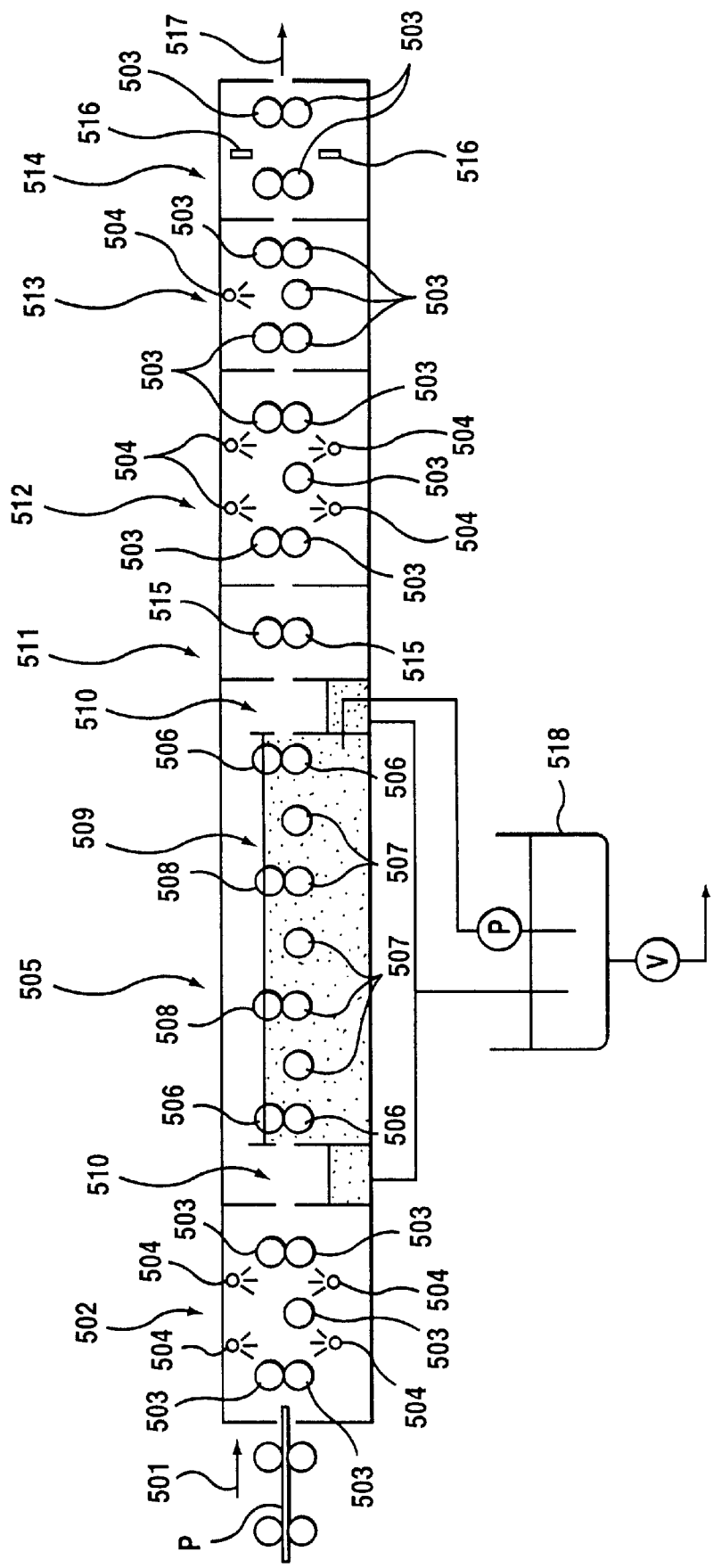
FIG. 12 is a view for explaining a construction of an oxidation processing apparatus in accordance with the embodiment of the present invention.

The essential part of the oxidation processing apparatus 27 is constructed as shown in FIG. 12. The board P is conveyed from the left side of FIG. 12 in a direction shown by an arrow 501 into the oxidation processing apparatus 27 after the board P is subjected to a shower bath with an etching solution, washing by water, wringing, and removal of liquid in the preprocessing apparatus 27a (FIG. 4).

The board P is conveyed horizontally by conveyor rollers 503 in a water processing section 502 while the front surface and the rear surface of the board P are sprayed with water from water ejecting nozzles 504 to form water films. Next, the board P is conveyed into an oxidation processing section 505, where the board P is transported horizontally via a pair of shutter rollers 506 and through the processing solution kept at a temperature of 60° C. in a black oxidation processing tank 509 by conveyor rollers 507, 508 for black oxidation processing of the board P.

After the board P is subjected to removal of liquid by a liquid removing rollers 515 in a liquid removing section 511, the board P is washed with water sprayed from water nozzles 504 in a water washing section 512, is subjected to a wringing processing while showered by a water nozzle 504, is dried with a dry air sprayed from an air ejection nozzle 516 in a drying section 514, and is transported in a direction shown by an arrow 517.

The board P is conveyed horizontally by conveyor rollers 503 even in the water washing section 512, the wringing section 513, and the drying section 514. Here, the water films are formed in advance on the surface of the board P in the water processing section 502 in order to prevent processing irregularities due to partial oxidation of the board P by a vapor of the processing solution just before the board P enters the processing solution in the black oxidation processing tank 509.

At the inlet and outlet of the black oxidation processing tank 509, there are respectively provided a pair of shutter rollers 506 having a cylindrical shape and constructed as follows. At ordinary times, the upper roller is in close contact with the lower roller by gravitation to seal the processing solution. However, when a board P is received or discharged, the upper roller is thrust upwards to open by a transportation force of the board P.

The processing solution is periodically supplied from a processing solution tank 518 into the black oxidation processing tank 509 by a pump P, as shown in FIG. 12. The processing solution overflowing from the black oxidation tank 509 is returned to the processing solution tank 518 via a reserve tank 510. In other words, the processing solution circulates between the black oxidation processing tank 509 and the processing solution tank 518. The processing solution in the processing solution tank 518 is periodically discharged via a drain valve V, and a new processing solution is supplied from a processing solution preparation tank (not shown).

Figure 13:
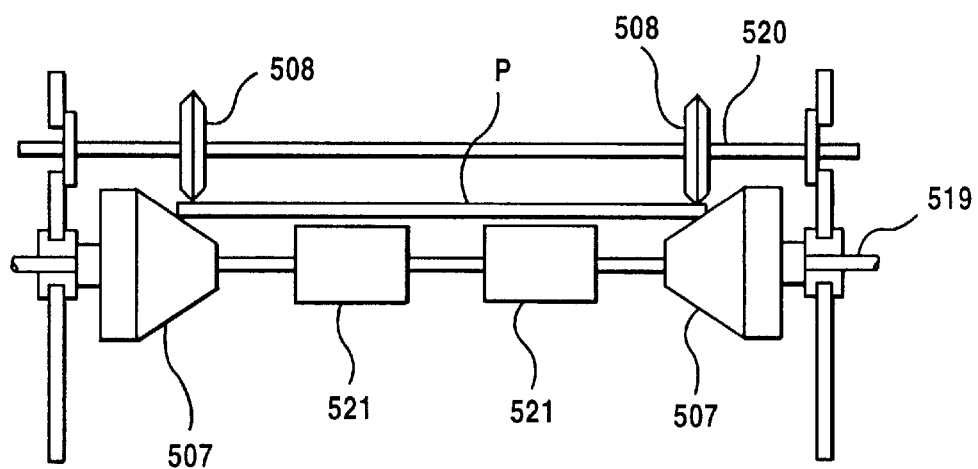
FIG. 13 is a view for explaining a construction of an essential part of the oxidation apparatus in accordance with the embodiment of the present invention.

The conveyor rollers 507, 508 disposed in the black oxidation processing tank 509 are constructed as shown in FIG. 13. The conveyor rollers 507 are fixed by driving shafts 519, and are driven by a motor (not shown). The conveyor rollers have a conical shape and support the board P by a point contact so as to minimize the surface area of the board P that are not in contact with the processing solution, thereby preventing the generation of processing irregularities in the board P.

The conveyor rollers 508 have a V-shaped tapered edge and are supported by a vertically movable shaft 520 so as to press down the board P with its weight so that the board will not float up. The auxiliary rollers 521 are rotatably supported by a driving shaft 519 and auxiliarily supports the board P when the board is warped or is about to fall off the conveyor roller 507.

As the processing solution, a 20 vol % aqueous solution of sodium hydroxide mixed with potassium peroxide at 3 wt % may be used.

6. An Insulating Layer Forming Apparatus

Figure 14:
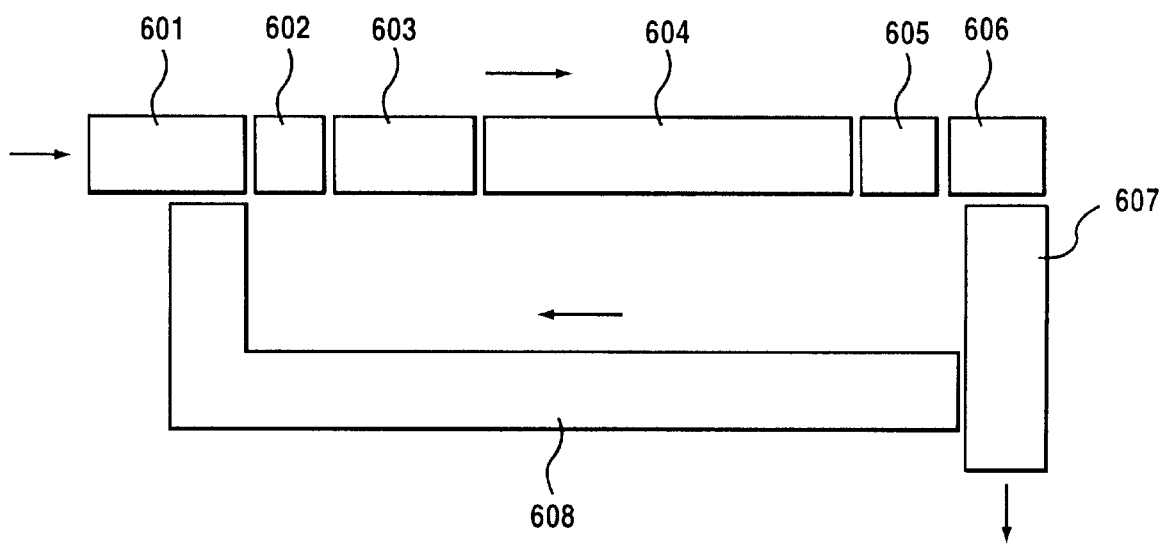
FIG. 14 is a view for showing a layout of an insulating layer forming apparatus in accordance with the embodiment of the present invention.

The insulating layer forming apparatus 29 is constructed as shown in FIG. 14. Namely, the conveyed board P is received by a board receiving section 601, and the size of the board P is recognized by a board recognizing section 602. Next, a coating section 603 coats one surface of the board P with a liquid-like resin and, after the board P is dried in a drying furnace 604, the board P is reversed in a reversing section 605, and a front-rear surface judgement section 606 judges whether both surfaces of the board P are coated with a liquid-like resin.

If it is judged that both of the surfaces are coated, the board P is discharged via a conveyor 607. If it is judged that only one surface is coated, the board P is returned to the board receiving section 601 and is then subjected to coating, drying, and reversing of the other surface.

Figure 15:
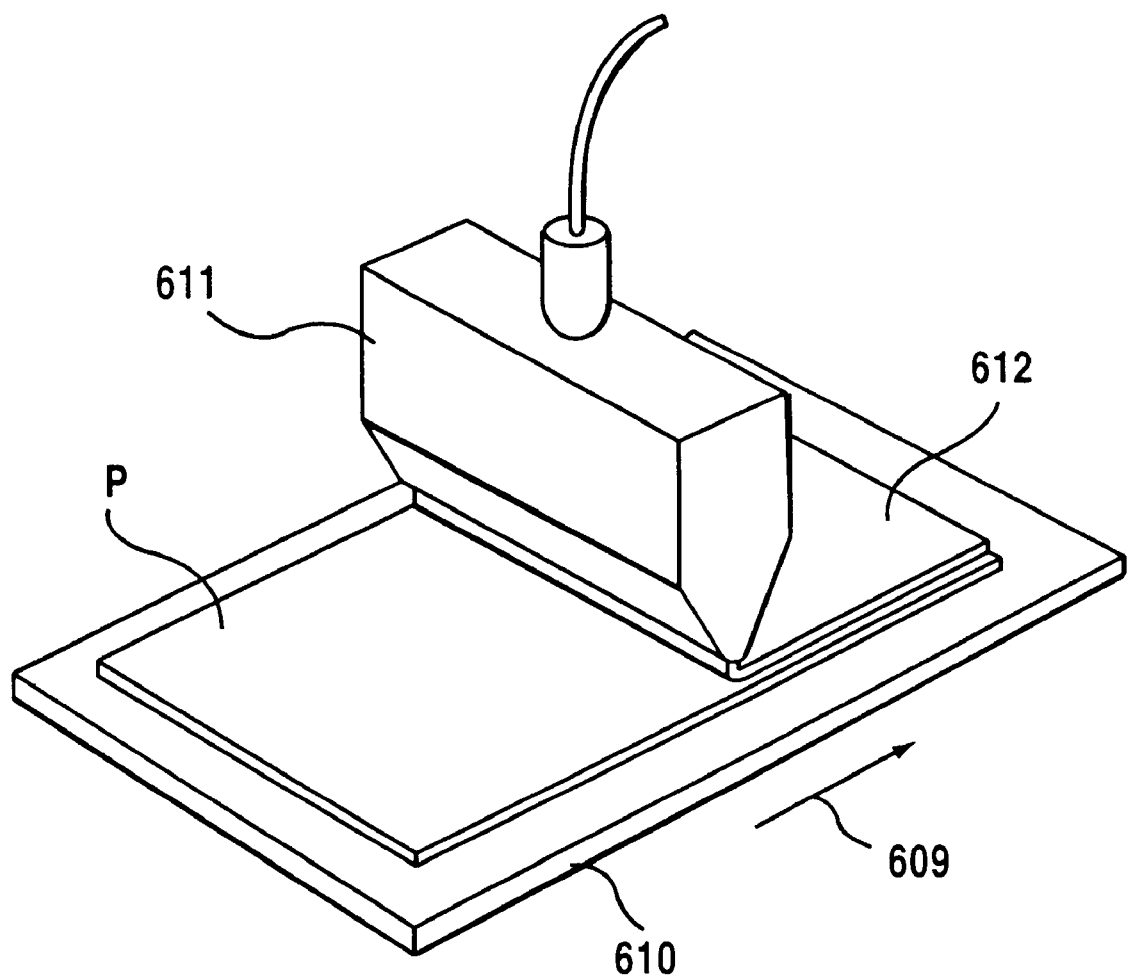
FIG. 15 is a perspective view for showing an essential part of the insulating layer forming apparatus in accordance with the embodiment of the present invention.

Here, in the coating section 603, the board P is fixed onto a table 610 moving in a direction shown by an arrow 609, as shown in FIG. 15, and a layer having a constant thickness (100±10 $\mu$m) is formed with a liquid-like resin 612 ejected from a coating head 611 at a predetermined width and length.

Figure 16:
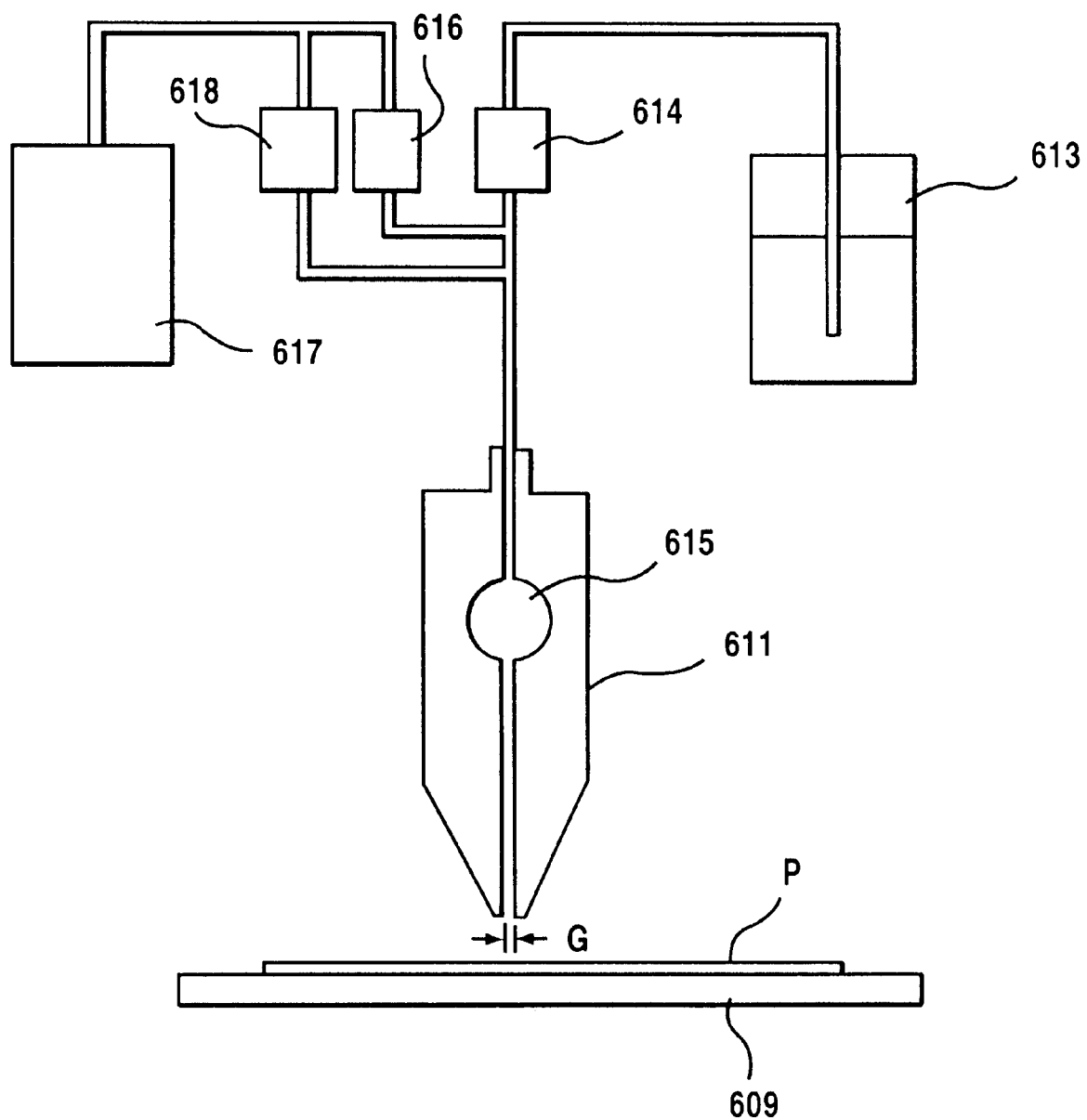
FIG. 16 is a view for explaining a construction of the essential part of the insulating layer forming apparatus in accordance with the embodiment of the present invention.

As shown in FIG. 16, a liquid-like resin pressed in a resin tank 613 is pressingly sent via a supply valve 614 to the coating head 611 to be ejected onto the board P. Here, the coating head 611 is equipped with a reserve tank section 615 to uniformly disperse the pressure along the width of the board so as to keep the coating thickness uniform. The ejection gap G of the front end of the coating head 611 is about 0.1 to 0.2 mm.

When the coating is finished, the supply valve 614 is closed first. In that state, however, the pressure remaining in the passageway between the supply valve 614 and the front end of the coating head 611 further ejects the liquid-like resin, so that it is not possible to stop the ejection with a good finish.

Therefore, as soon as the supply valve is closed, a residual pressure release valve 616 is opened so that the liquid-like resin is drawn into a drainage tank 617 to reduce the pressure of the liquid-like resin. Further, by opening a suckback valve 618, the liquid-like resin is pulled up from the front end of the coating head 611. In this way, the ejection of the liquid-like resin is stopped with a good finish, and the length of coating on the board P is controlled with a good accuracy.

The liquid-like resin to be used in the present invention may be a liquid-like thermosetting epoxy resin. An example thereof is a liquid-like resin containing a bisphenol type epoxy resin as a major component and mixed with a brominated epoxy resin for improving chemical resistance, an imidazole type hardener for adjusting the hardening rate, a talc type organic filler for preventing deformation of the board, a thixotropy imparting agent for improving the coating property, a silicone type anti-foaming agent for improving the contact with the copper foil, and a viscosity adjusting solvent.

7. A Copper Foil Laminating Apparatus

Figure 17:
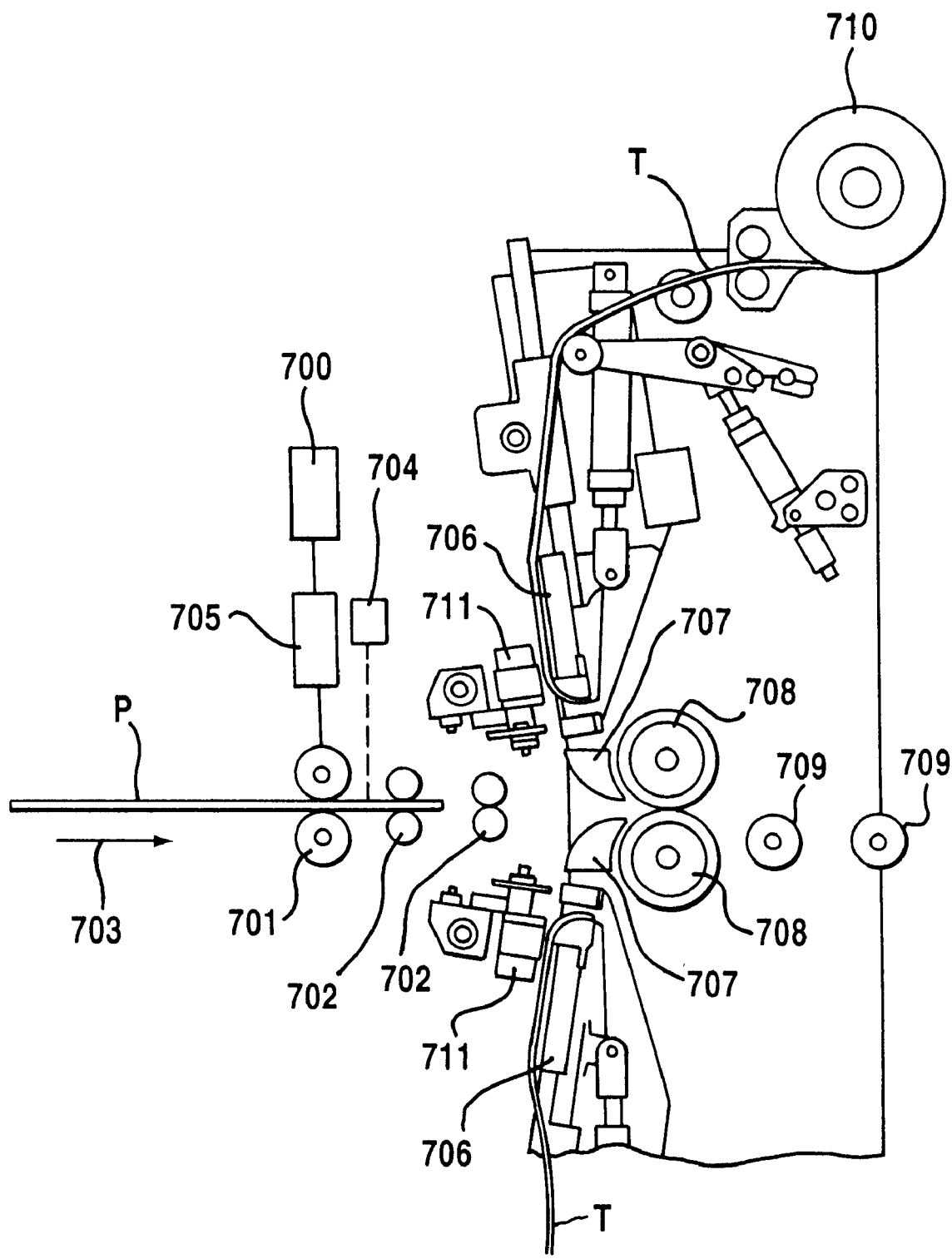
FIG. 17 is a view for explaining a construction of an essential part of a copper foil laminating apparatus in accordance with the embodiment of the present invention.

The essential part of the copper foil laminating apparatus 32 is constructed as shown in FIG. 17. The board P is subjected to preheating in a prestep conveyor furnace 31 so that the insulating layers on both surfaces of the board P may have a temperature of about 180° C., and is then transported into the copper foil laminating apparatus 32.

The board P is supplied by conveyor rollers 701 in a direction shown by an arrow 703 in FIG. 17, and is further conveyed by conveyor rollers 702. The front end of the board P is detected by a sensor 704, and a counter 700 begins to count output pulses of a rotary encoder 705 mounted to the conveyor rollers 701.

Figure 18:
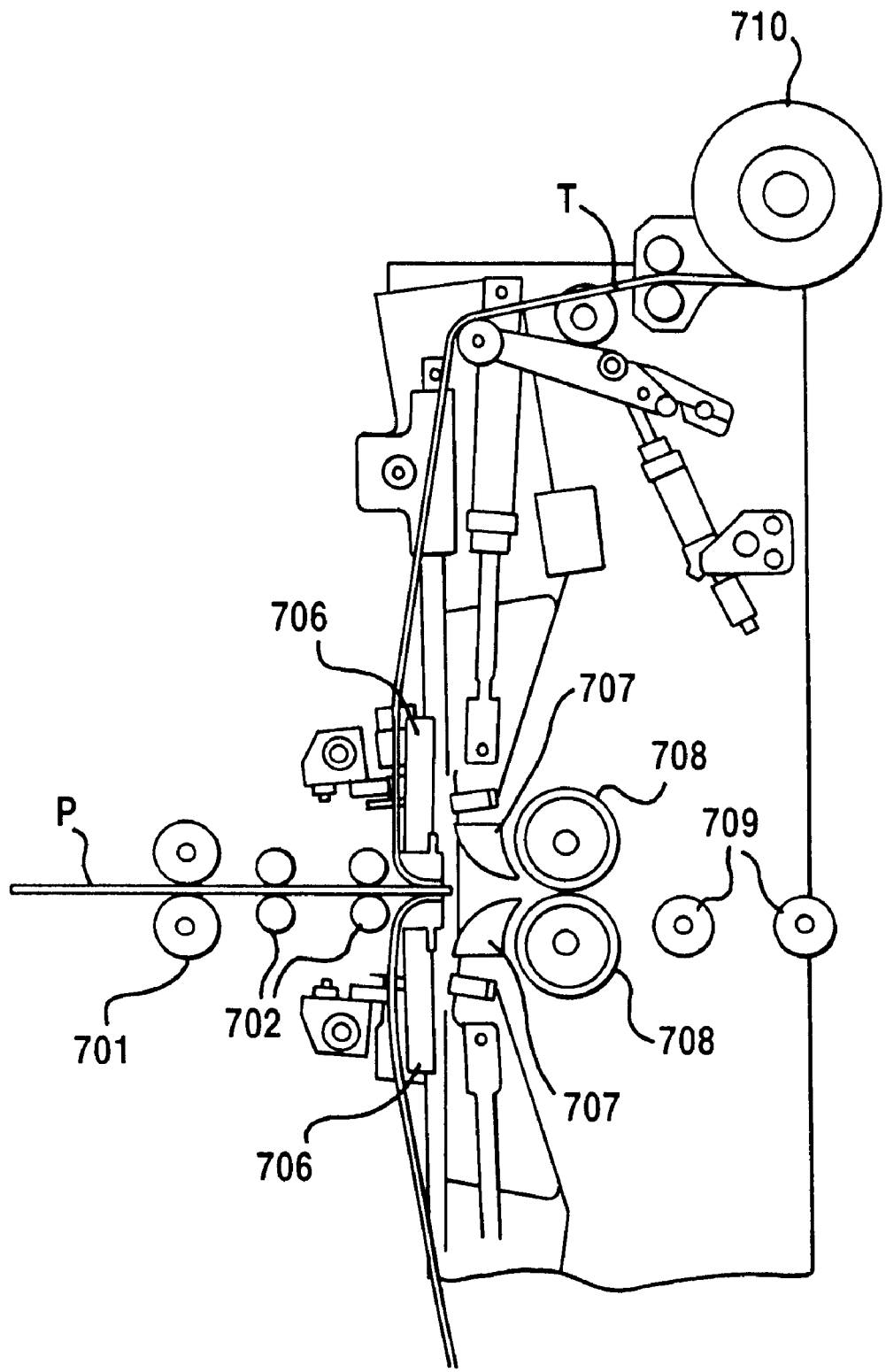
FIG. 18 is a view for explaining an operation of the essential part of the copper foil laminating apparatus in accordance with the embodiment of the present invention.

When a predetermined number of pulses have been counted, namely, when the board P reaches a predetermine position as shown in FIG. 18, the conveyor rollers 701 and the conveyor rollers 702 stop rotating. In accordance with this, a pair of tacking plates 706 holding by sucking with air pressure the front tips of the copper foil tapes T (width 328 mm) having an adhesive thereon approach the board P, and each of the front tips of the copper foil tapes T is pressed and stuck onto each of the surfaces of the board P.

Figure 19:
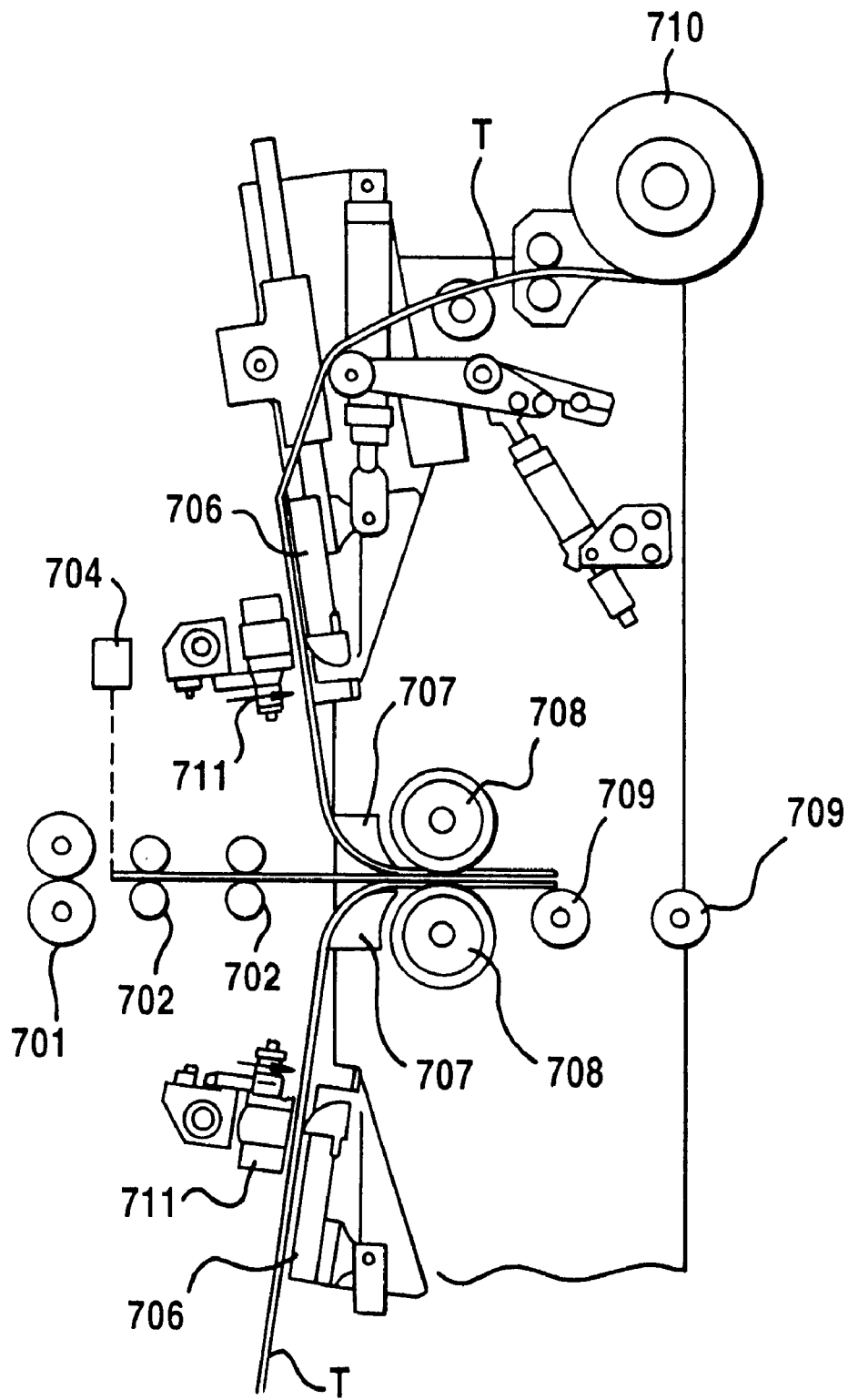
FIG. 19 is a view for explaining an operation of the essential part of the copper foil laminating apparatus in accordance with the embodiment of the present invention.

Then, the conveyor rollers 701 and the conveyor rollers 702 start rotating again to guide the board P between a pair of guide levers 707 to introduce the board P into a place between a pair of press-heating rollers 708, whereby the copper foil tapes T are pressed by heat onto the board P from the front end to the rear end by the press-heating rollers 708, as shown in FIG. 19.

Figure 20:
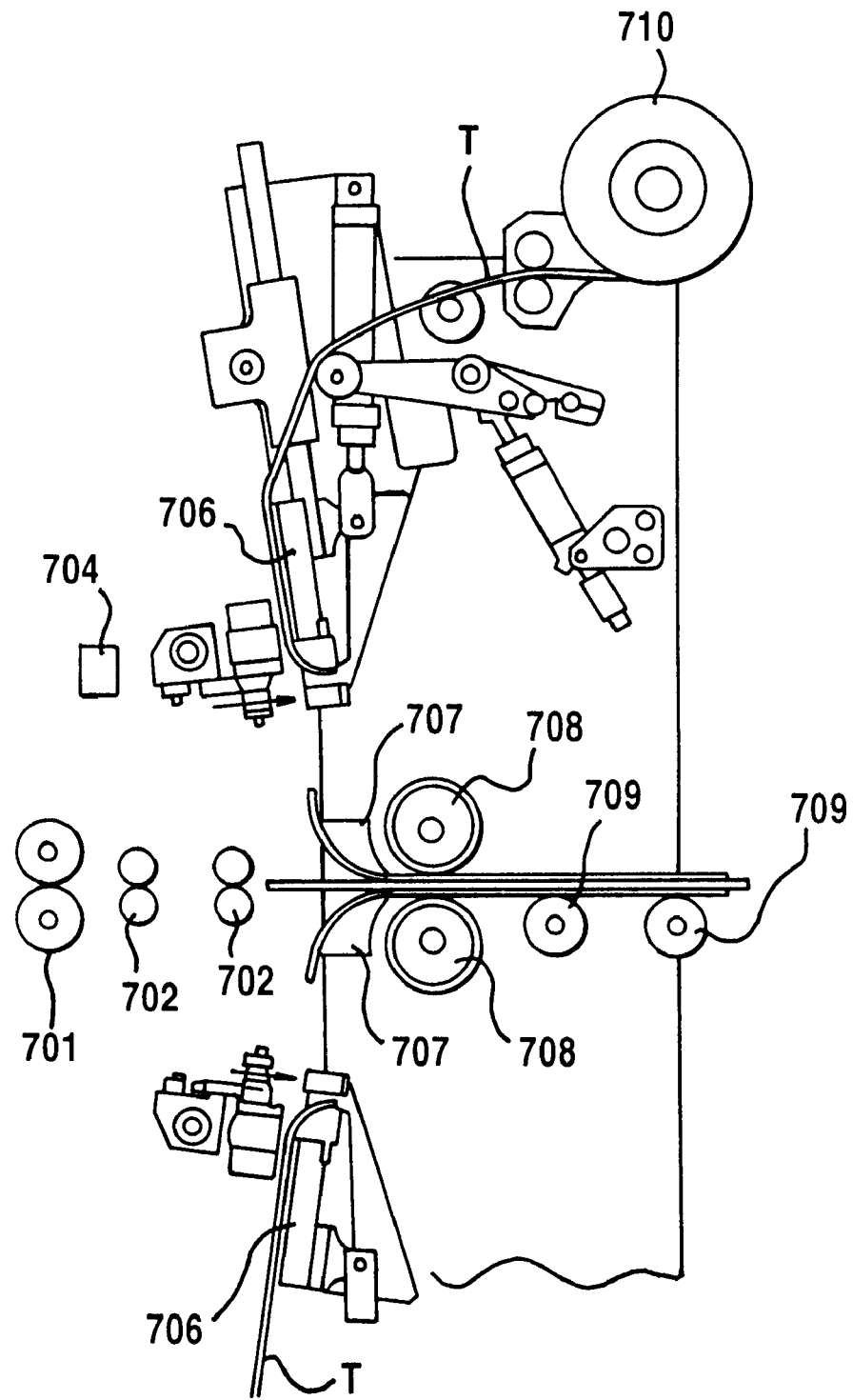
FIG. 20 is a view for explaining an operation of the essential part of the copper foil laminating apparatus in accordance with the embodiment of the present invention.

After the rear end of the board P is detected by the sensor 704, the output pulses of the rotary encoder 705 are counted by the counter 700 and, when the rear end of the board P reaches a predetermined position, a pair of cutters 711 operate to cut the upper and the lower tapes T, as shown in FIG. 20. The cut ends of the tapes T are each sucked by air pressure onto the tip of the provisional attaching plate 706 and the guide lever 707.

When the board P is conveyed by press-heating rollers 708 and discharging rollers 709, the tape T sucked onto the guide lever 707 moves, while sliding on the guide lever 707, to be heatingly pressed onto the board P. Here, the copper foil tapes T are supplied from a pair of reels 710 (one of which is not shown).

An example of the copper foil tape T to be used is a tape made by coating an adhesive resin on one surface of a copper foil (18 μmt) to a thickness of 25 to 30 μm, the adhesive resin being in a B-stage state (a half-hardened state) at ordinary temperature.

The press-heating roller 708 comprises a nichrome (nickel-chrome) wire heater which can soften an adhesive of the copper foil tape T at a temperature of about 110° C. to press and stick the tape T heatingly onto the insulating layer of the board P. After the cut tape T is sucked, the guide lever 707 gradually decreases its sucking force so that the end of the copper foil tape T is smoothly placed onto the board P, thereby preventing generation of buckling or creases at the end of the copper foil tape T.

In this way, the board P having a copper foil tape T laminated thereon is discharged by a discharging rollers 709. The provisional attaching plates 706 then return to the position shown in FIG. 17, and the copper foil laminating apparatus 32 waits for the next board P to be supplied.

8. A Hole Filling Apparatus

Figure 21:
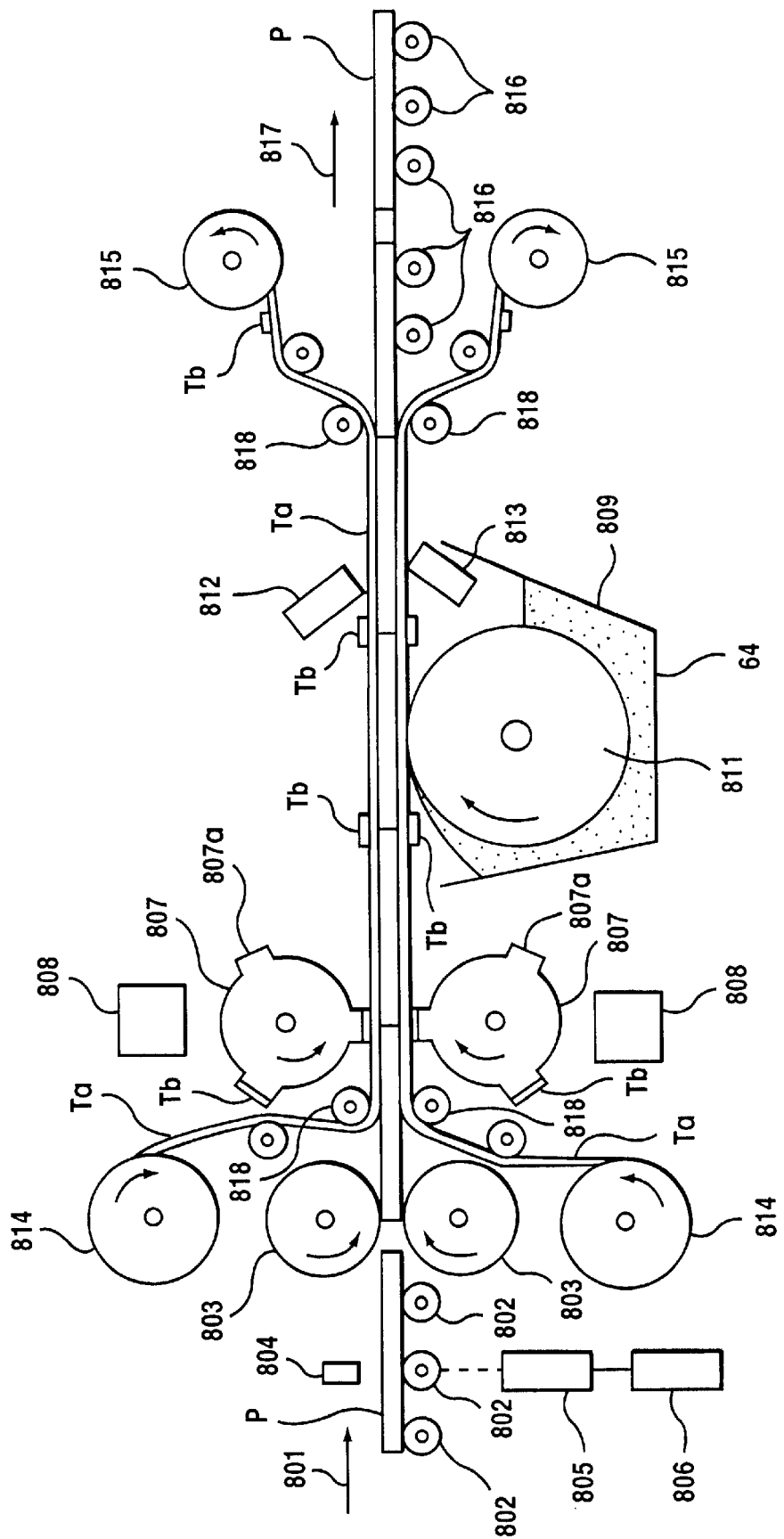
FIG. 21 is a view for explaining a construction of an essential part of a hole filling apparatus in accordance with the embodiment of the present invention.

The essential part of the hole filling apparatus 45 is constructed as shown in FIG. 21. Namely, when a board P is supplied in a direction shown by an arrow 801 from the left side in FIG. 21, the board P is further conveyed by the conveyor rollers 802. When the front end of the board P is detected by a sensor 804, a counter 806 begins to count outputs from a rotary encoder 805 mounted to one of the conveyor rollers 802 so as to calculate the position of the front end of the board P thereafter. When the front end of the board P is held between a pair of pressing rollers 803 and reaches a position impinging onto the rear end of the preceding board P, the conveyor rollers begin to rotate. By this operation of the pressing rollers 803, the board P can follow the preceding board P in close contact without overlapping with each other.

Figure 22:
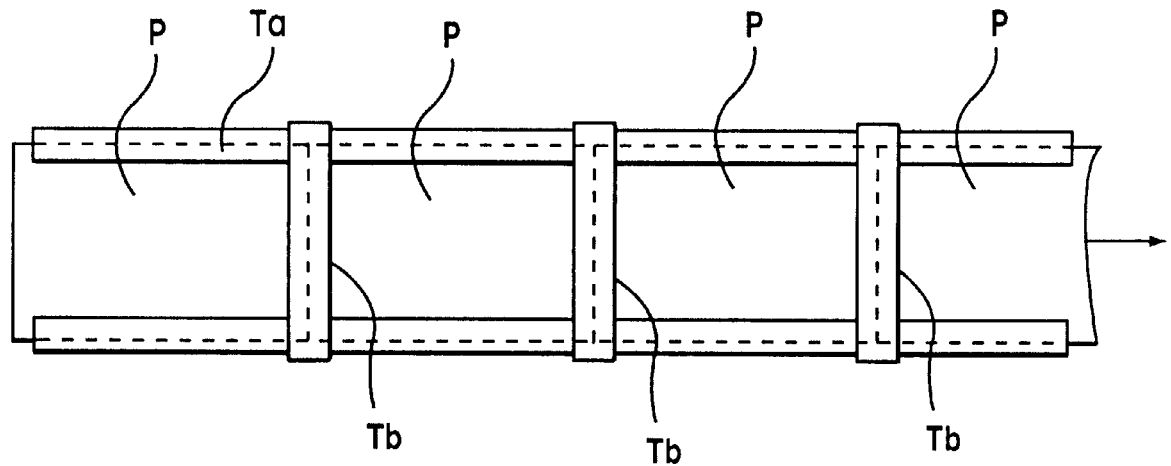
FIG. 22 is a plan view for showing boards being processed by the hole filling apparatus in accordance with the embodiment of the present invention.

Next, when the board P proceeds by forward rotation of the pressing rollers 803, plastic tapes Ta (width: 22 mm) supplied by a pair of reels 814 are stuck onto both surfaces of the board P by pressing rollers 818, as shown in FIG. 22. Then, a lateral tape pasting drum 807 with a cylindrical shape having three band-like projections 807a on its perimeter along its axial direction sticks onto an abutment of two adjacent boards P a plastic tape Tb with a predetermined length held on the projection 807a.

Next, an ink 64 stored in an ink pan 809 is applied onto the entire bottom surface of the board P by an ink filling roller 811. The ink 64 ejecting through the through-hole onto the top surface of the board P is removed by an upper squeegee 812, and the excessive ink 64 adhering to the bottom surface of the board P is removed by a lower squeegee 813.

Figure 23:
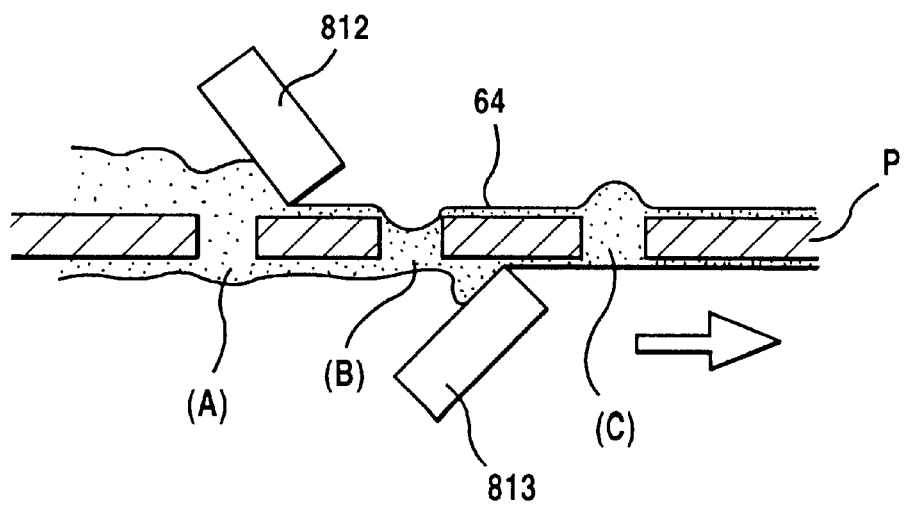
FIG. 23 is a cross sectional view for showing the boards being processed by the hole filling apparatus in accordance with the embodiment of the present invention.

Here, with respect to one through-hole of the board P, the ink 64 filling the through-hole as shown in FIG. 23 (A) subsides in the through-hole as the board P proceeds by the removing operation of the upper squeegee 812, as shown in (B). However, since the lower squeegee 813 operates from the bottom surface of the board P to thrust the ink 64 subsiding in the through-hole upwards as shown in (C), the ink 64 sufficiently fills the through-hole again.

The tape Ta is longitudinally supplied to the board P from the reel 814, and the tape Tb is laterally supplied from a tape supplier 808 to the board P via the lateral tape pasting drum 807. Both of the tapes are stuck onto the board P in a ladder-like shape and are thereafter rolled up by reels 815, as shown in FIG. 22.

Thus, the ink 64 is applied onto the effective area Re (FIG. 7) without adhering to the periphery of the board P by the presence of the tape Ta and the tape Tb, and the through-hole is sufficiently filled with the ink 64. The board P is then discharged in a direction shown by an arrow 817 by discharging rollers 816. An example of the ink 64 to be used is an ultraviolet ray curing type ink (PLUSFINE PTR924W manufactured by Goo Chemicals Co., Ltd. in Japan).

9. A Spray Coating Apparatus

Figure 24:
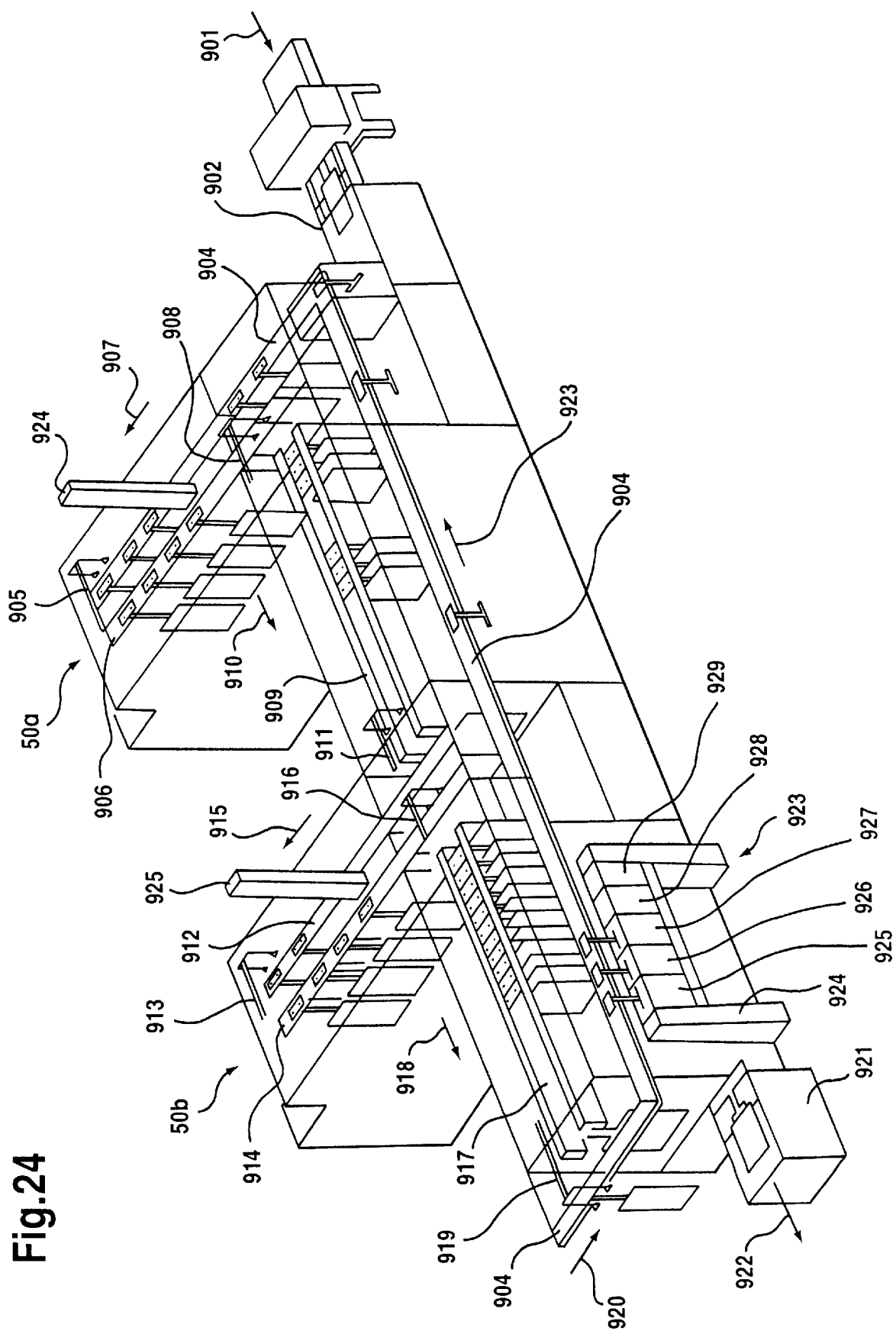
FIG. 24 is a perspective view for showing a spray coating apparatus in accordance with the embodiment of the present invention.
Figure 25:
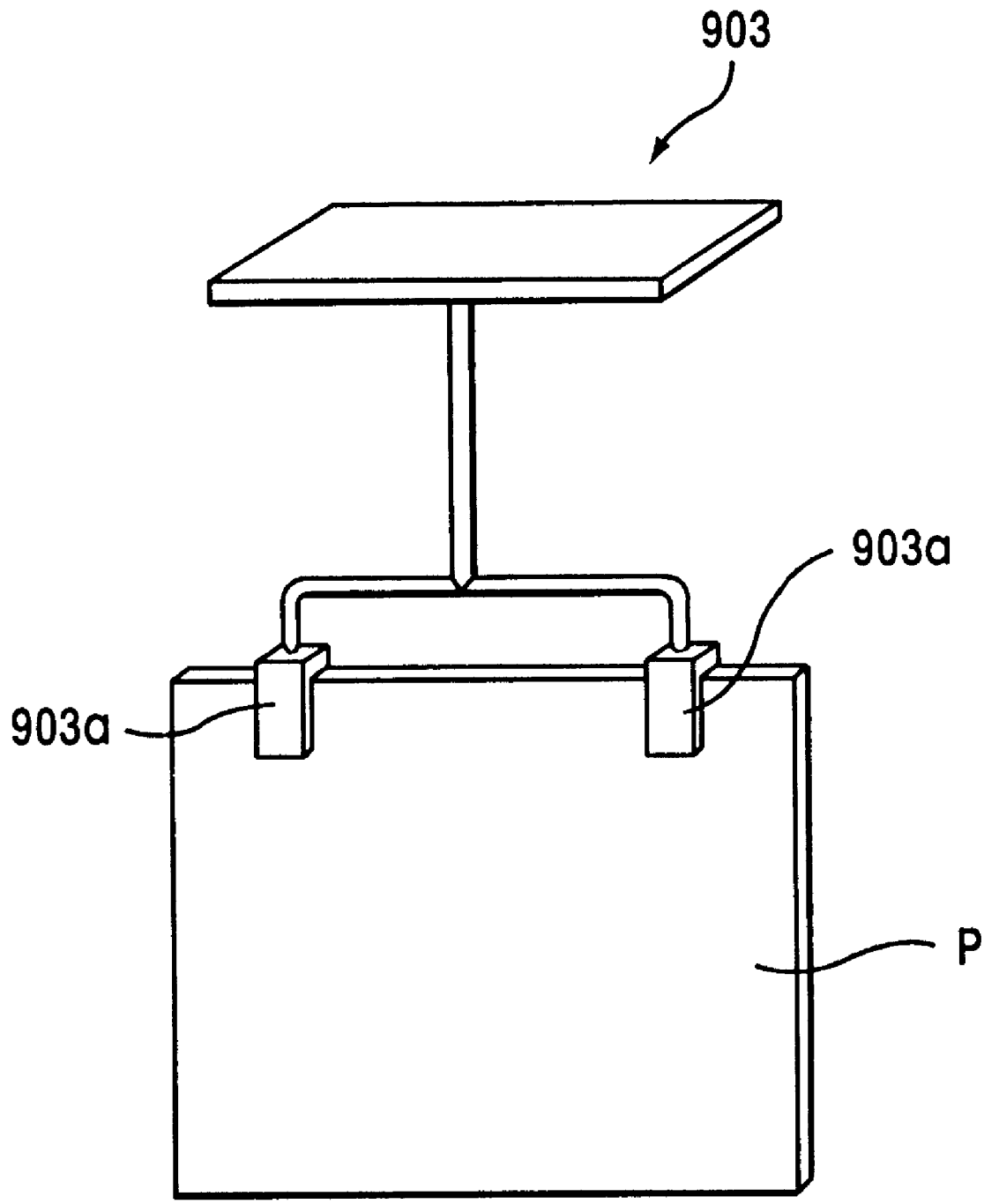
FIG. 25 is a perspective view for showing a hanger of the spray coating apparatus in accordance with the embodiment of the present invention.

The essential part of the spray coating apparatus 50a, 50b is constructed as shown in FIG. 24. Namely, when a board P is supplied in a direction shown by an arrow 901, the board P is mounted, by a loader 902, to clamp claws 903a of a hanger 903 suspended from a chain conveyor, as shown in FIG. 25.

The board P is then conveyed in a direction 907 by a chain conveyor 904. When the board P reaches the end of the chain conveyor 904, the hanger 903 holding the board P is lifted up by a lifting transporter 905 to be transferred to a chain conveyor 906.

When the board P is transported in a direction opposite to the arrow 907 and reaches the end of the chain conveyor 906, the board P together with the hanger 903 is transferred to a chain conveyor 909 by a lifting transporter 908.

When the board P is transported in a direction shown by an arrow 910 and reaches the end of the chain conveyor 909, the board P is transferred to a chain conveyor 912 by a lifting transporter 911. When the board P is transported in a direction shown by an arrow 915 and reaches the end of the chain conveyor 912, the board P together with the hanger 903 is transferred to a chain conveyor 914 by a lifting transporter 913. When the board P is transported in a direction opposite to the arrow 915 and reaches the end of the chain conveyor 914, the board P together with the hanger 903 is transferred to a chain conveyor 917 by a lifting transporter 916.

Further, when the board P is transported in a direction shown by an arrow 918 and reaches the end of the chain conveyor 917, the board P is transferred to the chain conveyor 904 by a lifting transporter 919. When the board P is transported in a direction shown by an arrow 920 and reaches a position over an unloader 921, the board P is removed from the hanger 903 by the unloader 921 and is discharged in a direction shown by an arrow 922.

The hanger 903 having released the board P is transported in a direction shown by an arrow 923 by the chain conveyor 904 and is returned to an upper portion of the loader 902 to be used again for mounting a supplied board P.

To the plurality of boards P thus successively moving, a spray head 924 scatters a resist solution in a spray-like manner in the spray coating apparatus 50a. Here, the spray head 924 applies the resist solution onto the front surface of the board P being transported by the chain conveyor 904 in a direction shown by the arrow 907, and applies the resist solution onto the rear surface of the board P being transported by the chain conveyor 906 in a direction opposite to the arrow 907.

At this time, a high voltage (for example, 40,000 V) is applied between the spray head 924 and the board P so that the board P is electrostatically coated with the resist solution. Since the chain conveyor 904 and the hanger 903 each comprises a conductor made of metal, the above high voltage is applied to the copper foil of the board P via the chain conveyor 904 and the hanger 903. The board P coated with the resist solution on both surfaces thereof is heated and dried while advancing on the chain conveyor 909 in a direction shown by the arrow 910.

Both surfaces of the dried board P is electrostatically coated with a cover coating solution by a spray head 925 in a spray coating apparatus 50b in the same manner as in the above. The board P is then heated and dried while advancing on the chain conveyor 917 in a direction shown by the arrow 918 so that a cover coating layer is laminated on both surfaces of the board P. Subsequently, the board P is removed from the hanger 903 by the unloader 921 to be discharged.

On the other hand, when the hanger 903 having released the board P in the unloader 921 is conveyed by the chain conveyor 904 to reach a position over a washing apparatus 923, washing tanks 925 to 928 and a drying tank 929 mounted on a lifting apparatus 924 are raised to wash and dry the hanger 903 in the following manner.

Namely, the washing tanks 925, 926 contains an alkaline liquid agent (such as a sodium carbonate solution diluted to 0.2 to 0.6%) and, in the beginning, the hanger 903 is dipped successively in these tanks for a predetermined amount of time (with the bath temperature being maintained at 40 to 55° C.). Here, each of the tanks is equipped with an ultrasonic wave washing apparatus, whereby the resist adhering to the hanger 903 is dissolved and removed by physical processing with an ultrasonic wave as well as by chemical processing with a liquid agent.

The hanger 903 having finished the removal process with the alkaline agent is washed with hot water in the washing tank 927 (maintained at a temperature of 35 to 55° C.).

An ultrasonic wave washing apparatus is also introduced here to completely remove, in the washing tank 927, the remaining resist that has not been removed in the washing tanks 925, 926. Subsequently, the slimy substance and the like on the surface of the board P is washed away by the final washing of the board P in the washing tank 928.

Thus, the introduction of the ultrasonic wave washing apparatus in each of the washing tanks makes it possible to remove the resist which is dissolved and floating in an alkaline solution.

Subsequently, the hanger 903 is sprayed with a hot air of 100 to 120° C. in the drying tank 929 to completely dry up the hanger 903 by removing water drops.

Since the hangers are always cleaned in washing tanks before they are used again, it is possible to maintain a good electric conductivity of the board which is needed at the time of electrostatic coating and also to prolong the life of the hangers simply by periodically renewing the alkaline agent solution and the water.

According to the present invention, since the same type of processing sections located at various positions on the line are disposed in a common block, it is possible to simplify the accompanying equipments such as a clean room and a drainage system. Also, according to the present invention, it is possible to manufacture a variety of products by repeatedly using some of the sublines.

What we claim is:

1. A manufacturing line comprising;
    a plurality of processing sections disposed in a series for manufacturing printed circuit boards by continuously conveying and processing boards through the plurality of processing sections,
    in which the plurality of processing sections include at least two specific processing sections for conducting a common type of processes, and the specific processing sections are disposed in a common area.

2. A manufacturing line according to claim 1, in which the specific processing sections are light exposure processing sections and the common area is a clean area.

3. A manufacturing line according to claim 1, in which the specific processing sections are wet processing sections that require feeding and draining of water, wherein the common area comprises a water feed and drainage system capable of commonly processing the feeding and draining of each of the wet processing sections.

4. A manufacturing line according to claim 1, which is partitioned into a plurality of sublines disposed in a field, wherein the specific processing sections are individually provided in at least two of the sublines.

5. A manufacturing line according to claim 4, wherein inlet and outlet sections of the sublines are disposed in a local area of the field.

6. A manufacturing line according to claim 5, in which each of the sublines is formed approximately in a U-shape between the inlet section and the outlet section.

7. A manufacturing line according to claim 4, in which one of the sublines including the specific processing section is capable of repeating the steps of patterning a metal foil on the board and forming another metal foil via an insulating film on the patterned metal foil, and another of the sublines forms through-holes on the board and patterns the metal foil to complete the board as a printed circuit board.

8. A manufacturing line according to claim 1, in which the board has a metal foil disposed on a surface thereof, and in which the plurality of processing sections disposed in a series include a polish processing section for subjecting the metal foil on the surface of the board to surface roughening, the polish processing section comprising a conveyor roller for conveying the board, a sensor for detecting a position of the board, a first polishing roller and a second polishing roller for rotating respectively in a forward direction and in a backward direction with respect to a conveying direction of the board while being in contact with the surface of the conveyed board, and a controller for temporarily stopping the first polishing roller before a rear end of the board is released from the first polishing roller, for driving the first polishing roller after the rear end of the board is released, for temporarily stopping the second polishing roller before a front end of the board is brought into contact with the second polishing roller, and for driving the second polishing roller after the front end of the board is brought into contact with the second polishing roller.

9. A manufacturing line according to claim 1, in which the plurality of processing sections disposed in a series include a dip coating section for forming a photoresist film on a surface of the board, the dip coating section comprising a resist tank for storing a resist solution and an elevator for dipping the board into the resist solution with the surface thereof being vertical and lifting it up, in which the elevator halfway pulls up the board dipped in the resist solution, lifts down the board again, and pulls the board out of the resist solution.

10. A manufacturing line according to claim 1, in which the board has a copper foil disposed on a surface thereof, and the plurality of processing sections disposed in a series include an oxidation processing section for subjecting the copper foil of the board to a black oxidation process, and the oxidation processing section comprises a liquid tank through which the board is continuously conveyed horizontally while being dipped in an oxidation processing solution.

11. A manufacturing line according to claim 10, in which the oxidation processing section further comprises a preprocessing section for wetting the surfaces of the board with water and for subsequently supplying the board into the liquid tank.

12. A manufacturing line according to claim 10, in which the plurality of processing sections disposed in a series include, as a subsequent section to the oxidation processing section, an insulating layer forming section for forming an insulating layer by applying a liquid-like resin onto a surface of the board processed in the oxidation processing section, the insulating layer forming section including a table on which the board is mounted to be conveyed and an ejection head for ejecting a band-shaped liquid-like resin onto the surface of the board to a length corresponding to a size of the board in a conveying direction, the ejected resin having a width corresponding to the size of the board in a direction perpendicular to the conveying direction.

13. A manufacturing line according to claim 1, in which the plurality of processing sections disposed in a series include a spray coating section for forming a photoresist film on a surface of the board, the spray coating section including receiving and delivering sections for receiving and delivering the boards respectively, a suspension conveyor section for repeating an operation of conveying to the delivering section the board received at the receiving section while suspending the board with an electrically-conductive suspender and returning the suspender to the receiving section, an electrostatic coating section for applying a voltage via the suspender to the board conveyed from the receiving section to the delivering section and electrostatically coating the board with a liquid-like resist by spraying, and a washing section for washing the suspender returning to the receiving section from the delivering section.

14. A manufacturing line according to claim 1, in which the plurality of processing sections disposed in a series include a processing section for forming a through-hole on the board and a filling section for filling the through-hole of the board with a filling material, the filling section including a conveyor section for conveying the board while holding the board horizontally, a coating roller for applying the filling material onto a lower surface of the board to fill the through-hole with the filling material, an upper squeegee and a lower squeegee for removing respectively the unnecessary filling material ejecting on the upper surface of the board through the through-hole and the unnecessary filling material applied onto the lower surface, in which the lower squeegee is disposed downstream of the upper squeegee in a conveying direction of the board.

15. A manufacturing line according to claim 2, in which the plurality of processing sections disposed in a series include an identifier affixing section for affixing onto the board an identifier representing the kind of printed circuit board to be manufactured, and include an identifying section for reading the identifier as a previous section to the exposure processing section and as a subsequent section to the identifier affixing section.

16. A manufacturing line according to claim 15, in which the identifier consists of through-holes formed on the board, whereby the identifier allows the kind of board to be identified by eye inspection and is also identifiable by an optical reading means.

17. A manufacturing line according to claim 1, in which the plurality of processing sections disposed in a series include a laminate processing section for continuously supplying a metal foil onto a plurality of boards having a resin layer disposed on a surface thereof so as to laminate the metal foil on each of the boards, the laminate processing section comprising a bonding section for bonding a front tip of the continuously supplied metal foil onto the board, a cutting section for cutting the continuously supplied metal foil in accordance with a length of the board, and a pressing section for bonding the cut metal foil onto the board.

18. A manufacturing line for manufacturing printed circuit boards by continuously conveying and processing boards through a plurality of processing sections disposed in a series, the manufacturing line including a stock section for storing a plurality of boards, wherein the stock section supplies the boards to a next processing section when the manufacturing line starts to operate, and the stock section stores a plurality of boards when the manufacturing line stops.

19. A manufacturing line according to claim 18, in which the stock section is disposed at a position where the board reaches after approximately T/2 hours from beginning of the processing, assuming that the time it takes for one board to go entirely through the manufacturing line is T hours.

20. A manufacturing line according to claim 18, in which the stock section comprises a plurality of substocks that are each capable of storing and discharging boards separately.

21. A manufacturing line according to claim 19, in which the stock section comprises a plurality of substocks that are each capable of storing and discharging boards separately.

* * * * *